(12) United States Patent
Taylor

(10) Patent No.: US 7,551,826 B2
(45) Date of Patent: Jun. 23, 2009

(54) INTEGRATED CIRCUIT EMPLOYING LOW LOSS SPOT-SIZE CONVERTER

(75) Inventor: Geoff W. Taylor, Mansfield, CT (US)

(73) Assignees: The University of Connecticut, Farmington, CT (US); Opel, Inc., Shelton, CT (US)

( * ) Notice: Subject to any disclaimer, the term of this patent is extended or adjusted under 35 U.S.C. 154(b) by 51 days.

(21) Appl. No.: 11/768,236

(22) Filed: Jun. 26, 2007

(65) Prior Publication Data

US 2009/0003399 A1   Jan. 1, 2009

(51) Int. Cl.
*G02B 6/10* (2006.01)
(52) U.S. Cl. .................. 385/129; 257/183
(58) Field of Classification Search .............. 385/1, 385/4, 8, 10, 11, 12, 122, 123, 124, 129, 385/130, 131; 257/183
See application file for complete search history.

(56) References Cited

U.S. PATENT DOCUMENTS

| | | | | |
|---|---|---|---|---|
| 6,031,243 | A * | 2/2000 | Taylor | 257/13 |
| 6,075,801 | A * | 6/2000 | Tamanuki et al. | 372/46.01 |
| 6,192,170 | B1 * | 2/2001 | Komatsu | 385/15 |
| 6,229,947 | B1 * | 5/2001 | Vawter et al. | 385/132 |
| 6,243,517 | B1 * | 6/2001 | Deacon | 385/50 |
| 6,282,345 | B1 * | 8/2001 | Schimpe | 385/50 |
| 6,293,688 | B1 * | 9/2001 | Deacon | 362/556 |
| 6,310,995 | B1 * | 10/2001 | Saini et al. | 385/28 |
| 6,321,011 | B2 * | 11/2001 | Deacon | 385/50 |
| 6,411,764 | B1 * | 6/2002 | Lee | 385/131 |
| 6,560,259 | B1 * | 5/2003 | Hwang | 372/45.01 |
| 6,778,737 | B2 * | 8/2004 | Shimoda | 385/43 |
| 6,834,071 | B2 * | 12/2004 | Sugiyama | 372/108 |
| RE38,682 | E * | 1/2005 | Taylor | 372/50.11 |

(Continued)

FOREIGN PATENT DOCUMENTS

JP   2001007440 A   *   1/2001

OTHER PUBLICATIONS

Tanaka et al., "Integrated external cavity laser composed of spot-size converted LD and UV written grating in silica waveguide on Si," Jun. 20, 1996, Electronics Letters, Vo. 32, No. 13, pp. 1202-1203.*

(Continued)

*Primary Examiner*—James P Hughes
*Assistant Examiner*—Peter Radkowski
(74) *Attorney, Agent, or Firm*—Gordon & Jacobson, PC

(57) ABSTRACT

An integrated circuit is provided with a photonic device and a spot-size converter waveguide device integrated on a common substrate. The spot-size converter waveguide device provides for transformation between a larger spot-size and a smaller spot-size corresponding to the photonic device. The spot-size converter waveguide device includes at least one of a bottom mirror and top mirror, which provide highly-reflective lower and upper cladding, respectively, for vertical confinement of light propagating through the waveguide device. The top mirror overlies opposing sidewalls of the spot-converter waveguide device, which provide highly-reflective sidewall cladding for lateral confinement of light propagating through the waveguide device. Advantageously, the highly-reflective lower cladding provided by the bottom mirror limits optical loss of the waveguide device. Similarly, the highly-reflective upper cladding and sidewall cladding provided by the top mirror limits optical loss of the waveguide device.

38 Claims, 11 Drawing Sheets

U.S. PATENT DOCUMENTS

| | | | |
|---|---|---|---|
| 6,873,638 | B2 | 3/2005 | Haase et al. |
| 6,917,729 | B2 | 7/2005 | Zediker et al. |
| 7,012,274 | B2 * | 3/2006 | Taylor .................. 257/12 |
| 7,015,120 | B2 * | 3/2006 | Taylor et al. ............. 438/479 |
| 7,037,742 | B2 * | 5/2006 | Slater et al. ............... 438/39 |
| 7,062,114 | B2 * | 6/2006 | Webjorn et al. ........... 385/14 |
| 7,158,701 | B2 * | 1/2007 | Dautartas .................. 385/37 |
| 7,251,406 | B2 * | 7/2007 | Luo et al. ................. 385/131 |
| 7,262,429 | B2 * | 8/2007 | Taylor ..................... 257/21 |
| 7,317,853 | B2 * | 1/2008 | Laurent-Lund et al. ....... 385/43 |
| 7,327,918 | B2 * | 2/2008 | Yamazaki et al. ........... 385/48 |
| 7,333,733 | B2 * | 2/2008 | Taylor et al. ............. 398/161 |
| 7,341,880 | B2 * | 3/2008 | Erchak et al. .............. 438/26 |
| 7,344,903 | B2 * | 3/2008 | Erchak et al. .............. 438/29 |
| 2002/0039469 | A1 * | 4/2002 | Jeong et al. ................ 385/43 |
| 2002/0131471 | A1 * | 9/2002 | Sugiyama ................. 372/108 |
| 2003/0053756 | A1 * | 3/2003 | Lam et al. .................. 385/49 |
| 2004/0081467 | A1 * | 4/2004 | Taylor et al. ............. 398/161 |
| 2004/0184156 | A1 * | 9/2004 | Gunn et al. ............... 359/629 |
| 2004/0202429 | A1 | 10/2004 | Margalit et al. |
| 2005/0230705 | A1 * | 10/2005 | Taylor ..................... 257/120 |
| 2006/0083272 | A1 * | 4/2006 | Heo et al. .................. 372/6 |
| 2006/0141682 | A1 | 6/2006 | Taylor et al. |
| 2007/0133990 | A1 * | 6/2007 | Kim et al. ................. 398/72 |
| 2007/0153858 | A1 * | 7/2007 | Kim et al. ................. 372/50.1 |

OTHER PUBLICATIONS

Lestra et al., "Monolithic Integration of Spot-Size Converted with 1.3-micron Lasers and 1.55-micron Polarization Insensitive Semiconductor Optical Amplifiers," Dec. 1997, IEEE Journal of Selected Topics in Quantum Electronics, vol. 3, No. 6, pp. 1429-1440.*

Bogaerts et al., "Basic structures for photonic integrated circuits in Silicon-on-insulator," 2004,Optics Express, vol. 12 Issue 8, pp. 1583-1591.*

Hou et al., "Monolithically integrated semiconductor optical amplifier and electroabsorption modulator with dual-waveguide spot-size converter input and output," 2005, Semiconductor Science and Technology, vol. 20, No. 9, Abstract.*

Valette., S. "State of the art integrated optics at LETI for achieving passive optical components," 1988, Journal of Modern Optics, vol. 35, No. 6, pp. 993-1005.*

"SI Method Applied to the Design of a Novel SiGE Based Mode Spot SizeConverter"Advances in the Spectral Index Method for Optoelectronic Design, Dr. Stephen Greedy, The University of Nottingham, Ph.D.Theses, 2002, Chapter 4, pp. 66-92 available at http://www.nottingham.ac.uk/ggiemr/publications/av_thesis.htm.

"A New Spectral Method for the Analysis of Coupled Rib and Buried Waveguides for Efficient Mode Spot Size Converters" Fourier Transformation Analysis of Optoelectronic and Circuits, Dr. Ana Vukovic, University of Nottingham, Ph.D.Theses, 1999, Chapter 6, pp. 203-228, available at http://www.nottingham.ac.uk/ggiemr/publications/av_thesis.htm.

Low Loss Nanophotonic Waveguides and Ring Resonators in Silicon-In-Insulator, Roel Baets et al, International School of Quantum Eletronics, 39th Course, AIP Conference Proceedings, vol. 709, May 2004.

Design and Fabrication of Tapered Waveguides in AlGaAs for Coupling ight in Nanoscale Optoelectronic Devices, Nathaniel Burt, 2004 NNIN REU Research Accomplishments, p. 28-29.

Optoelectronic/Photonic Integrated Circuits on InP between Technological Feasibility and Commercial Success, Ronald Kaiser, Helmit Heidrich, IEICE Transactions on Electronics, vol. E85-C, No. 4, Apr. 2002.

Fabrication and Characterization of Three-Dimensional Silicon Tapers, Anita Sure et al., Optics Express 3555, Dec. 2003, vol. 11, No. 26.

Optical Mode Converter Integration With InP-InGaAsP Active and Passive Waveguides Using a Single Regrowth Process, Xuejin Yan et al., IEEE Photonics Technology Letters, vol. 14, No. 9, Sep. 2002.

InP-Based Spotsize Converter for Integration with Switching Devices, J. Stulemeijer et al., IEEE Photonics Technology Letters, vol. 11, No. 1, Jan. 1999.

Spot Size Converters: An Overview, Kurt De Mesel, PhD. Thesis, University of Ghent, Belgium, Chapter 2, Oct. 16, 2002.

* cited by examiner

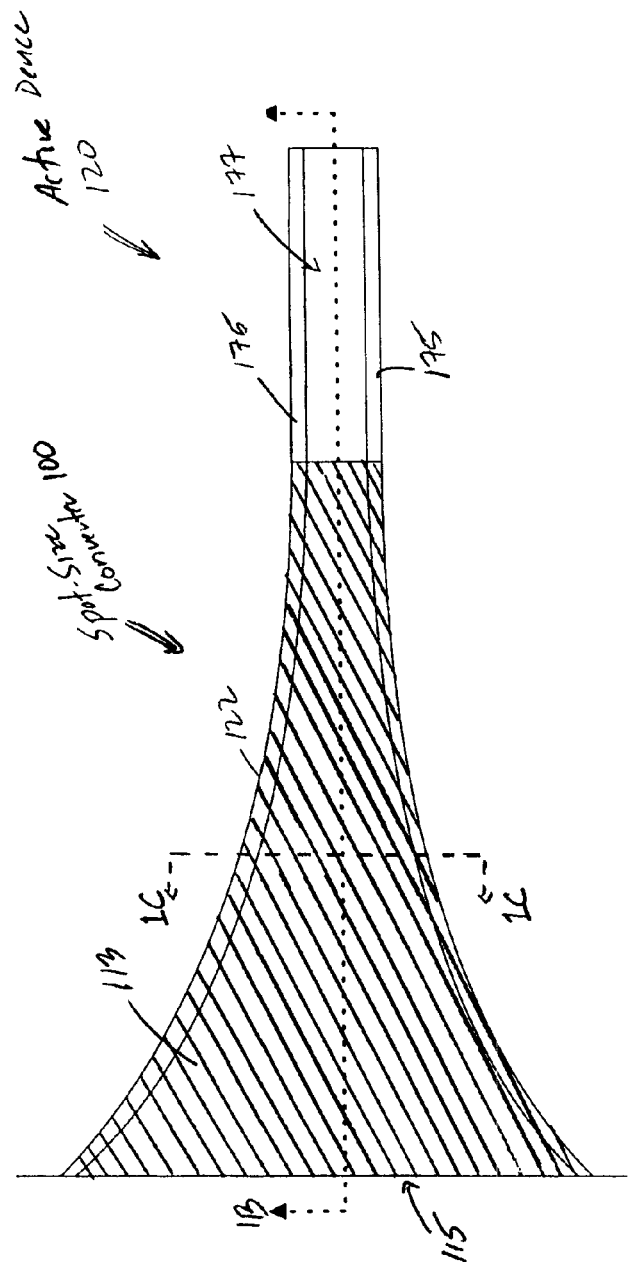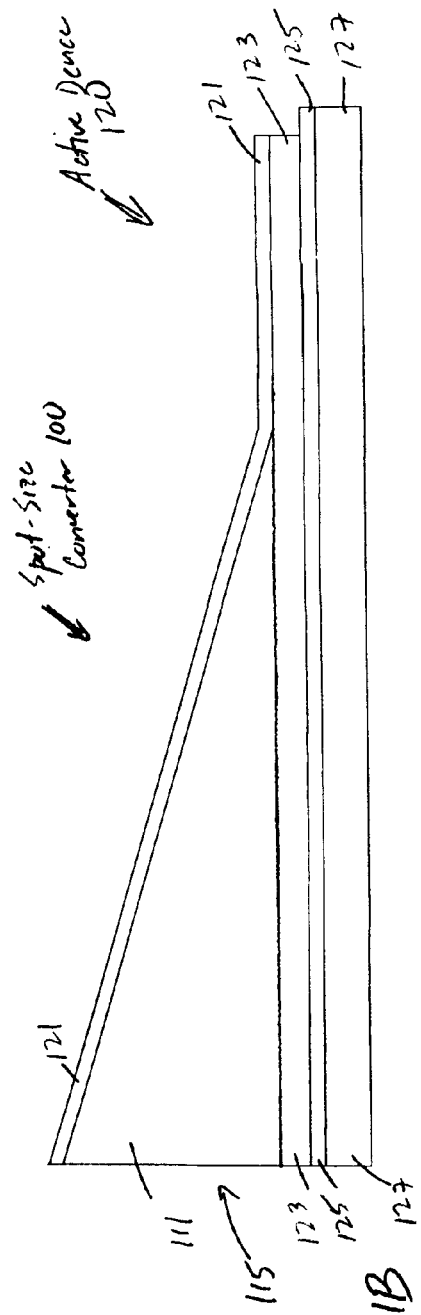
FIG. 1A
FIG. 1B

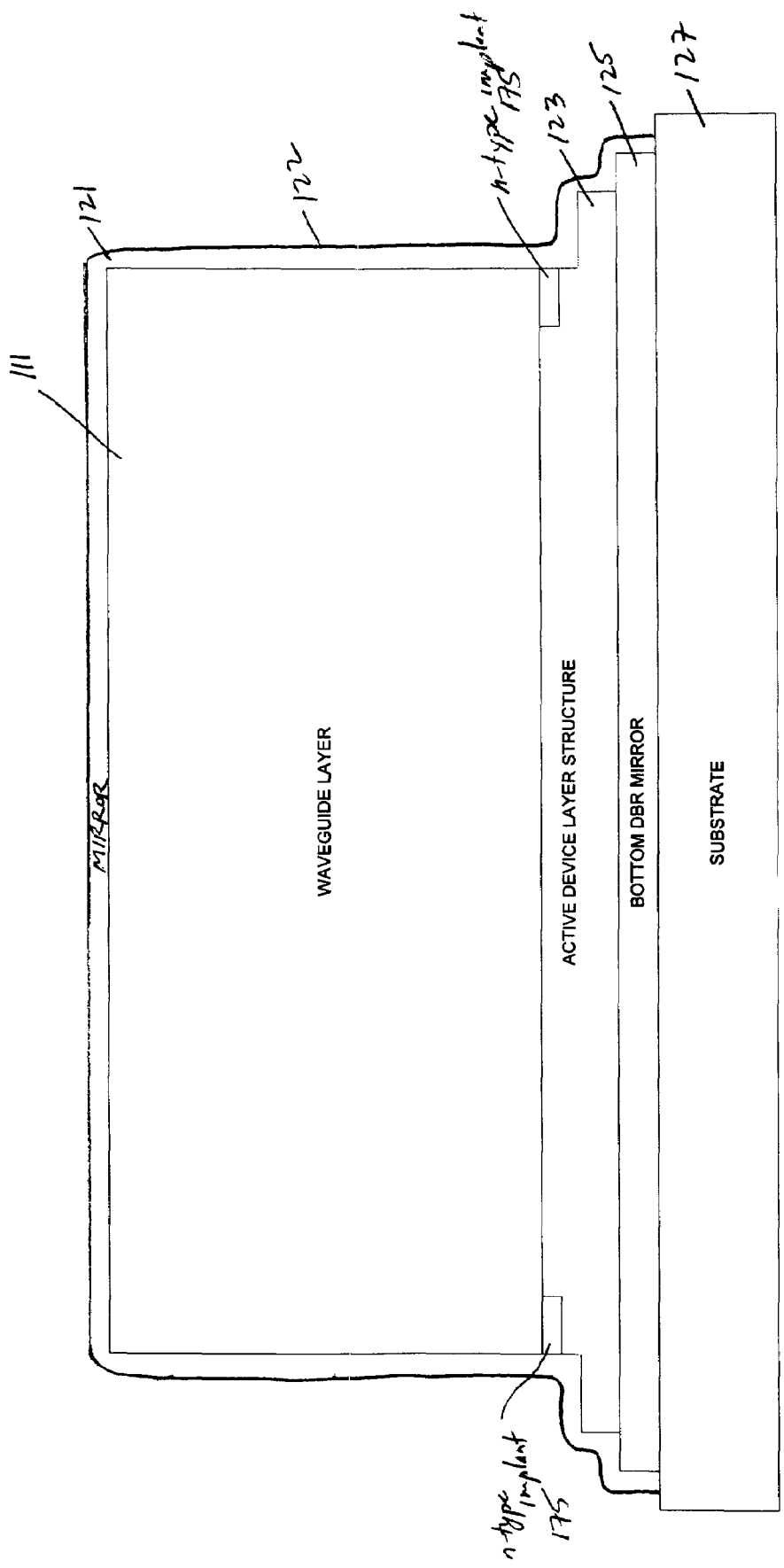

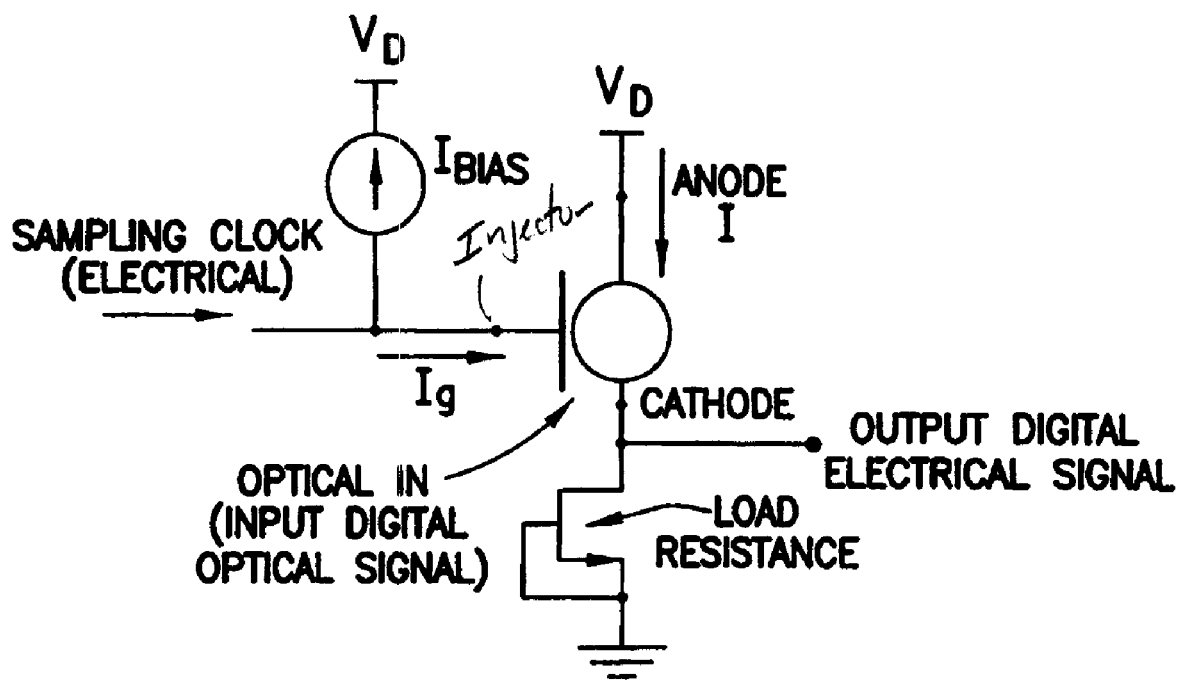
FIG.2 C1
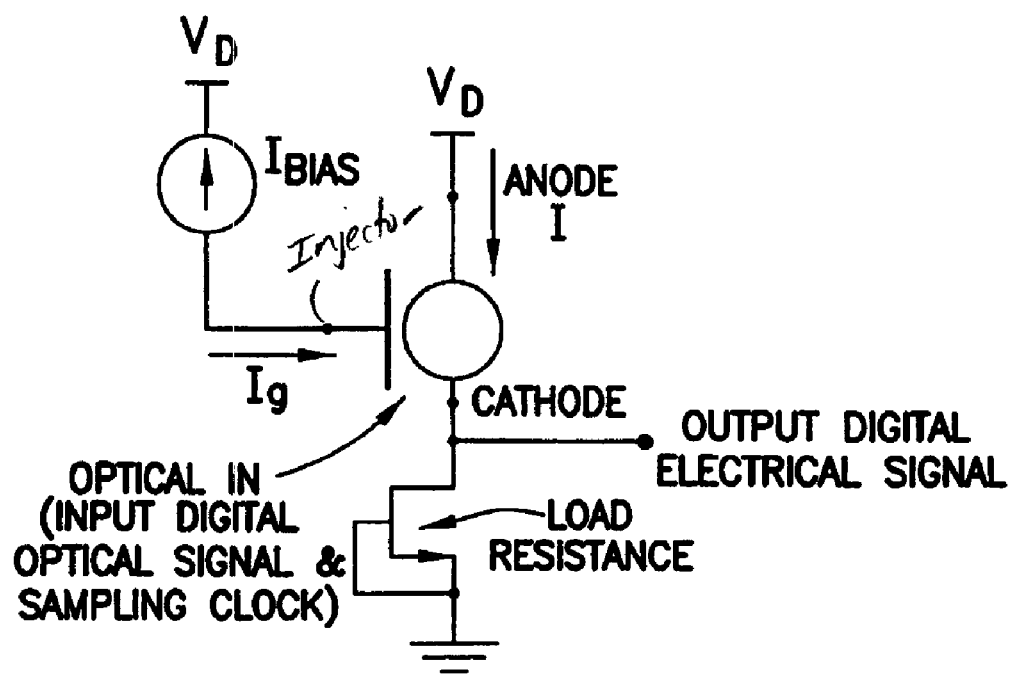
FIG.2 C2

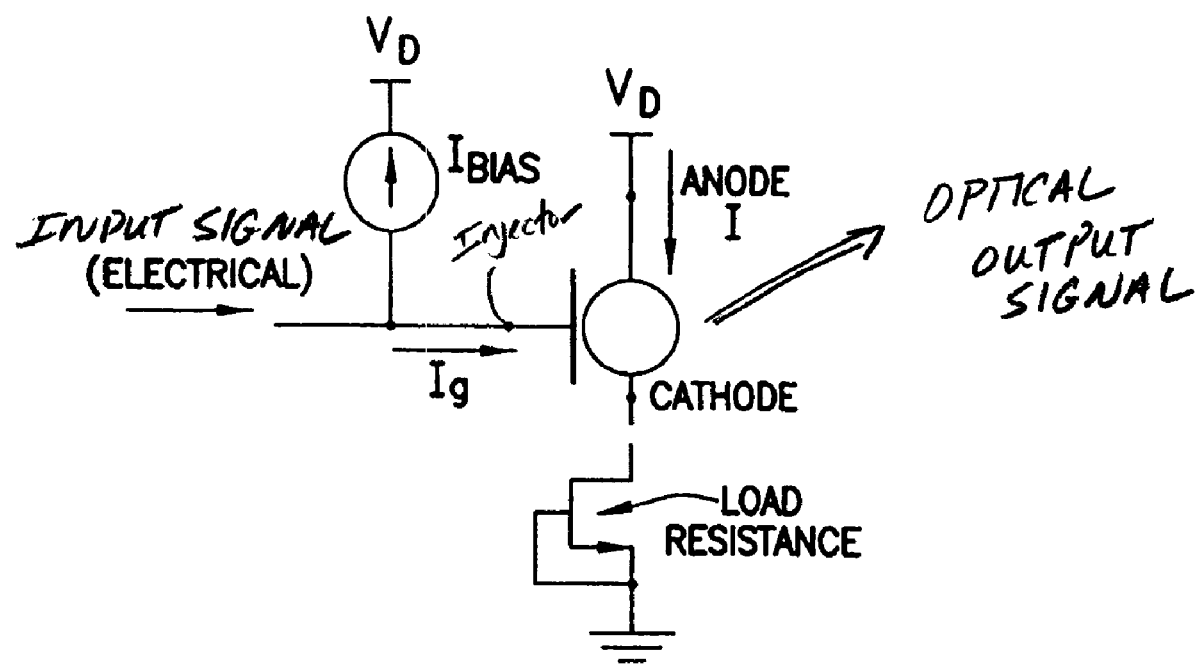
FIG.2C3

| | MATERIAL | DOPE TYPE | TYPICAL DOPE LEVEL | TYPICAL LAYER THICKNESS(Å) | LAYER IDENTIFIER |
|---|---|---|---|---|---|
| 30 { | InGaAs | P+ | 1E20 | 25 | 165b |
| 28 { | GaAs | P+ | 1E20 | 75 | 165a |
| | Al(.7)Ga(.3)As | P | 1E17 | 700 | 164b |
| | Al(.7)Ga(.3)As | P+ | 1E19 | 10 | 164a |
| | Al(.15)Ga(.85)As | P+ | 3.5E18 | 25 | 163d |
| 26 { | Al(.15)Ga(.85)As | | UD | 300 | 163c |
| | Al(.15)Ga(.85)As | N+ | 3.5E18 | 80 | 163b |
| | Al(.15)Ga(.85)As | | UD | 30 | 163a |
| | GaAs | | UD | 15 | 162 |
| 24 { | In(.20)Ga(.80)AsN QW/GaAs QW } x3 | | UD | 60 | 161 |
| | GaAs BARRIER | | UD | 100 | 160b |
| | GaAs | | UD | 150 | 160a |
| 22 { | Al(.15)Ga(.85)As | | UD | 5000 | 159 |
| | GaAs BARRIER | | UD | 100 | 158 |
| | In(.20)Ga(.80)AsN QW/GaAs QW } x3 | | UD | 60 | 157 |
| 20 { | GaAs | | UD | 15 | 156 |
| | Al(.15)Ga(.85)As | | UD | 30 | 155d |
| | Al(.15)Ga(.85)As | P+ | 3.5E18 | 80 | 155c |
| 18 { | Al(.15)Ga(.85)As | | UD | 300 | 155b |
| 16 { | Al(.15)Ga(.85)As | N | 3.5E18 | 80 | 155a |
| | Al(.7)Ga(.3)As | N | 1E17 | 700 | 154 |
| 14 { | GaAs | N+ | 3.5E18 | 2200 | 153 |
| | AlAs | | UD | 1701 | 151 |
| 12 { | GaAs } x7 | | UD | 696 | 152 |
| | AlAs | | UD | 1701 | 151 |
| 10 { | GaAs SUBSTRATE | | SI | | 149 |

FIG.3A

INTEGRATED CIRCUIT EMPLOYING LOW LOSS SPOT-SIZE CONVERTER

BACKGROUND OF THE INVENTION

1. Field of the Invention

This invention relates broadly to field of optoelectronic and photonic integrated circuits (and associated fabrication methodology) and, in particular, to integrated circuits that employ a spot-size converter for transforming mode of light from a large-size mode to a smaller-size mode or vice-versa.

2. State of the Art

Optoelectronic integrated circuits integrate photonic functionality (e.g., laser, optical detector, optical amplifier, optical modulator, optical coupler, passive coupler, passive waveguide) with electronic functionality (e.g., transistors) on a single chip. Photonic integrated circuits integrate multiple photonic functions on a single chip. Such integrated circuits typically employ active optical devices that have a tightly bound relatively small elliptical spot size. Off-chip optical elements (such as a fiber optic waveguide or free space optics) typically support a relatively large circular spot size. A spot-size converter is typically integrated on-chip between the off-chip optical element and the active optical device. For receive applications, it functions to transform the larger spot-size supported by the off-chip optical element to the smaller spot-size supported by the active optical device. For transmit applications, it functions to transform the smaller spot-size supported by the active optical device to the larger spot-size supported by the off-chip optical element.

Spot-size converters typically include a tapered design that provides a mechanism for adiabatic transformation between the larger spot-size of the off-chip element and the smaller spot-size of the active optical device. Such tapered designs may make use of lateral taper designs or vertical taper designs or both. For example, FIG. 5 shows a prior art design that employs a rib-on-rib structure, which is described in detail in Dr. Stephen Greedy, Ph. D. Theses entitled, "Advances in the Spectral Index Method for Optoelectronic Design", 2002, available from http://www.nottingham.ac.uk/ggiemr/publications/scg_thesis.htm. At the input/output facet, the upper waveguide (or rib) is cut-off, while the underlying waveguide (or rib) supports a mode similar in profile to the off-chip optical element (e.g., fiber optic waveguide, free space optics, etc.) that interfaces thereto. At the opposite end, the upper rib supports a mode similar in profile to the active optical device that interfaces thereto. For receive applications, as the upper rib progressively widens in the direction of propagation, it becomes the dominant guiding mechanism and at some point the light shifts from the lower rib to the upper rib undergoing the desired spot-size conversion. For transmit applications, as the upper rib progressively narrows in the direction of propagation, the bottom rib becomes the dominant guiding mechanism and at some point the light shifts from the upper rib to the lower rib undergoing the desired spot-size conversion. Fabrication of this design is an improvement over prior art designs as it requires only one planar epitaxial growth and two etch steps. However, the narrowing section of the upper rib (especially the cut-off tip of the upper rib adjacent the input/output facet) is difficult to fabricate and requires precise alignment, which typically results in unacceptable coupling losses. Moreover, the lower cladding for the device is provided by a lossy cladding layer, while the upper cladding is typically provided by the interface between the converter waveguide structure and air, which is lossy as light can escape from the waveguide into the air.

Thus, there remains a need in the art for an optoelectronic integrated circuit and/or a photonic integrated circuit that employs a spot-size converter waveguide that is easy to fabricate, that does not require such precise alignment tolerances, and that provides reduced coupling losses as compared to the prior art designs.

SUMMARY OF THE INVENTION

It is therefore an object of the invention to provide an integrated circuit that employs a spot-converter waveguide that is easy to fabricate, that does not require such precise alignment tolerances, and that provides reduced coupling losses as compared to the prior art designs.

It is another object of the invention to provide such an integrated circuit wherein the spot-converter waveguide device interfaces to a passive or active on-chip photonic device.

It is another object of the invention to provide such an integrated circuit wherein the spot-converter waveguide device and the photonic device as well as supporting electronic functionality are integrated together on-chip.

In accord with these objects, which will be discussed in detail below, an integrated circuit is provided with a photonic device and a spot-size converter waveguide device integrated on a common substrate. The spot-size converter waveguide device provides for transformation between a larger spot-size and a smaller spot-size corresponding to the photonic device. The spot-size converter waveguide device includes at least one of a bottom mirror and top mirror, which provide highly-reflective lower and upper cladding, respectively, for vertical confinement of light propagating through the waveguide device. The top mirror overlies opposing sidewalls of the spot-converter waveguide device, which provide highly-reflective sidewall cladding for lateral confinement of light propagating through the waveguide device. Advantageously, the highly-reflective lower cladding provided by the bottom mirror limits optical loss of the waveguide device. Similarly, the highly-reflective upper cladding and sidewall cladding provided by the top mirror limits optical loss of the waveguide device.

In the preferred embodiment, the bottom mirror is realized by a distributed bragg reflector (DBR) mirror structure, and the top mirror is realized from a plurality of layer pairs each comprising first and second dielectric materials with contrasting refractive indices.

In the preferred embodiment, the spot-sized converter waveguide device includes a vertically-tapered waveguide layer underlying the top mirror and laterally-tapered sidewalls underlying the top mirror.

The photonic device of the integrated circuit can carry out one or more of a wide variety of active photonic functions, such as laser transmission, optical-to-electrical conversion, bidirectional transmission and optical-to-electrical conversion of optical signals, optical amplification, optical modulation, optical coupling and cross-connection, and other optical processing functions. The photonic device of the integrated circuit can also carry out a passive photonic function. In the preferred embodiment, the photonic device of the integrated circuit is a thyristor device, which can be configured to carry out many of the active photonic functions listed above.

The integrated circuit is also preferably realized from a multilayer structure of group III-V materials that provides for monolithic integration of high speed transistor functionality, such as high-speed complementary HFET transistors and/or high-speed complementary bipolar transistors.

Additional objects and advantages of the invention will become apparent to those skilled in the art upon reference to the detailed description taken in conjunction with the provided figures.

BRIEF DESCRIPTION OF THE DRAWINGS

FIG. 1A is a top schematic view of an exemplary integrated circuit in accordance with the present invention.

FIG. 1B is a cross-sectional schematic view of the integrated circuit of FIG. 1A along the section 1B-1B.

FIG. 1C is a cross-sectional schematic of the integrated circuit of FIG. 1A along the section 1C-1C.

FIG. 3A depicts an active thyristor device of the integrated circuit.

FIG. 2C1 is a pictorial illustration of an exemplary configuration of the thyristor device of FIG. 2A as an optical detector for optical-to-electrical conversion in conjunction with an electrical sampling clock signal.

FIG. 2C2 is a pictorial illustration of an exemplary configuration of the thyristor device of FIG. 2A as an optical detector for optical-to-electrical conversion in conjunction with an optical sampling clock signal.

FIG. 2C3 is a pictorial illustration of an exemplary configuration of the thyristor device of FIG. 2A as a laser emitter.

FIG. 3A is a schematic showing an exemplary layer structure made with group III-V materials, and from which the integrated circuit of the present invention can be made.

FIG. 3B shows the energy bandgap diagram of the structure of FIG. 3A.

FIG. 3C depicts an active thyristor device of the integrated circuit; and FIG. 3D depicts the spot-size converter device of the integrated circuit.

DETAILED DESCRIPTION OF THE PREFERRED EMBODIMENTS

Figure 2A:
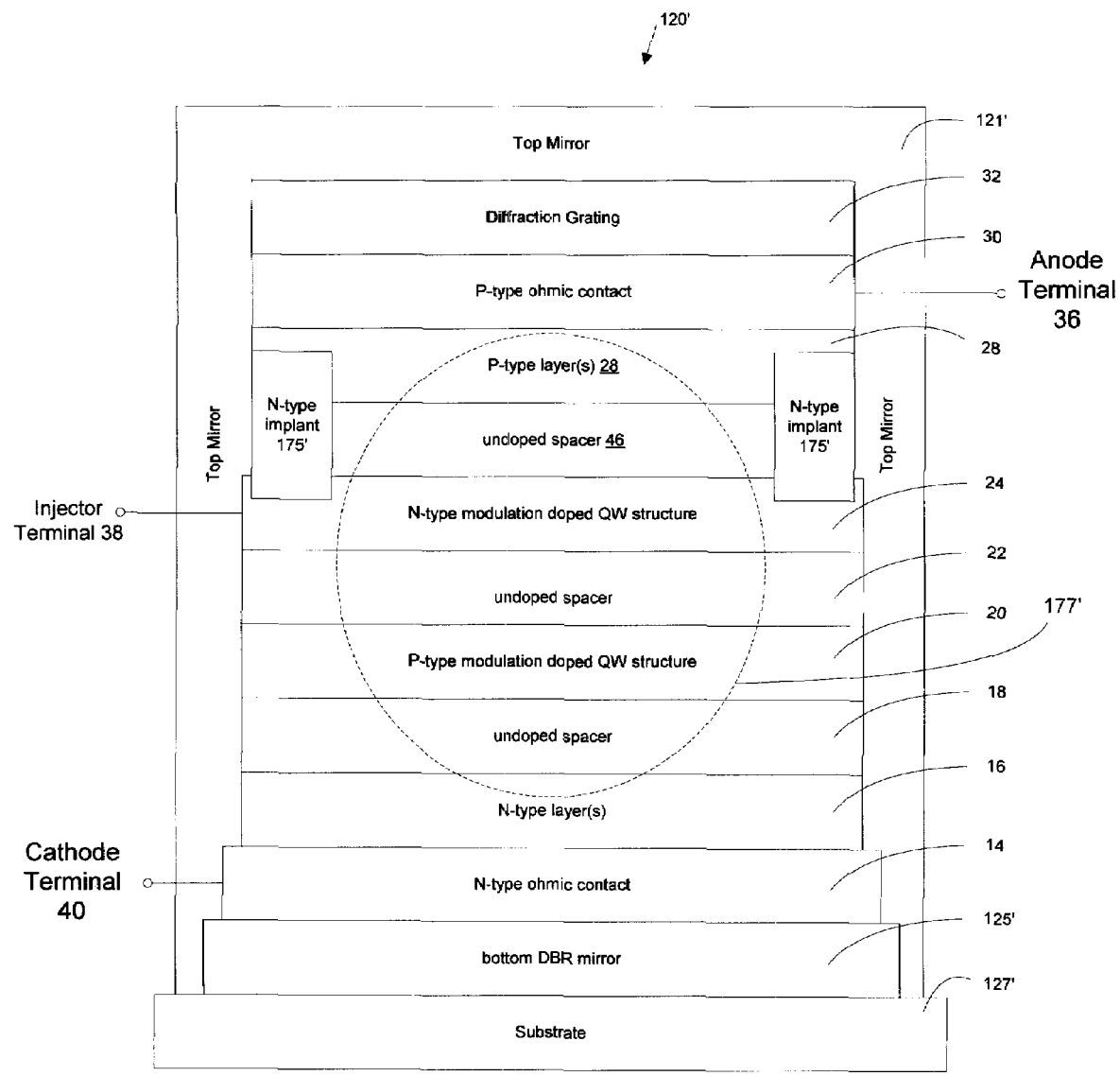
FIGS. 2A and 2B are cross-sectional schematics of an embodiment of an integrated circuit in accordance with the present invention.

FIGS. 1A-1C illustrate an integrated circuit in accordance with the present invention, which includes a spot-size converter waveguide device 100 integrated with an active device 120 on a single substrate 127. As best shown in FIG. 1C, a bottom DBR mirror 125 is formed on the substrate 127. An active device layer structure 123 is formed above the bottom DBR mirror 125. The active device 120 utilizes the active device layer structure 123 to carry out a particular photonic function, such as laser transmission, optical-to-electrical conversion, bidirectional transmission and optical-to-electrical conversion of optical signals, optical amplification, optical modulation, optical coupling and cross-connection, and other optical processing functions. All of these functions can be carried out for one or more fixed or tunable wavelengths. The active device structure 123 includes an active waveguide region 177 which preferably extends along the length of the active device 120. The photonic function of the active device 120 is carried out along the active waveguide region 177. For example, light is emitted from the active waveguide region 177 for laser transmission, while light is absorbed in the active waveguide region 177 for optical-to-electrical conversion. In the illustrative embodiment, the active waveguide region 177 is defined by an aperture between ion implanted regions 175 (preferably of an n-type formed by implanting n-type ions) that extend along the length of the active device 120 as best shown in FIG. 1A.

The spot-size converter waveguide device 100 includes a combination of several mesas, which include substantially-vertical surfaces (sidewalls) and substantially-horizontal surfaces formed in the active device layer structure 123 between a top mirror 121 and the bottom DBR mirror 125 to provide for guiding of light therein. A vertically-tapered waveguide layer 111 is formed over the top mesa of the active device layer structure 123 along the length of the waveguide device 100 as best shown in FIGS. 1B and 1C. A highly-reflective top mirror 121 is formed continuously over the vertically-tapered waveguide layer 111 to impart a vertical taper to the top mirror 121 as it extends along the length of the waveguide device 100. The sidewalls 122 of the waveguide device 100 are laterally tapered along the length of the waveguide device 100 as best shown in FIG. 1A. The top mirror 121 is formed continuously over the device to cover the laterally-tapered sidewalls 122 to thereby realize a laterally-tapered mirror that overlies the sidewalls of the waveguide device 100 over it length. The vertically-tapered top mirror 121 and the bottom DBR mirror 125 provide for vertical confinement of light along the length of the waveguide device 100, while the laterally-tapered mirror 121 that covers the sidewalls of the device provide for lateral confinement of light along the length of the waveguide device 100. The vertical and lateral tapered design of the waveguide device 100 transforms the mode of light along the waveguide device from a larger-size mode at one end (the input/output facet 115 of FIGS. 1A and 1B) to a smaller-size mode at the other end adjacent the active device 120. The smaller-size mode substantially conforms to and is aligned with the active waveguide region 177 of the active device 120. This limits optical loss in coupling the active device 120 to an off-chip larger-size optical element (e.g., fiber or free-space optics).

In the preferred embodiment, the lateral and vertical tapered design of the waveguide device 100 transforms the spot-size in a gradual "adiabatic" manner, which is designed to keep all optical power in one mode during propagation therethrough.

An anti-reflective (AR) coating may be applied to the input/output facet 115 of the spot-size converter waveguide device 100 as well as to the off-chip optical element (e.g., terminal end of the off-chip fiber optic waveguide). Alternatively, an indexing matching gel can be disposed between the input/output facet 115 of the spot-size converter waveguide device 100 and the off-chip optical element (e.g., terminal end of the off-chip fiber optic waveguide). These mechanisms reduce back reflections and the coupling losses that result therefrom.

Figure 2B:
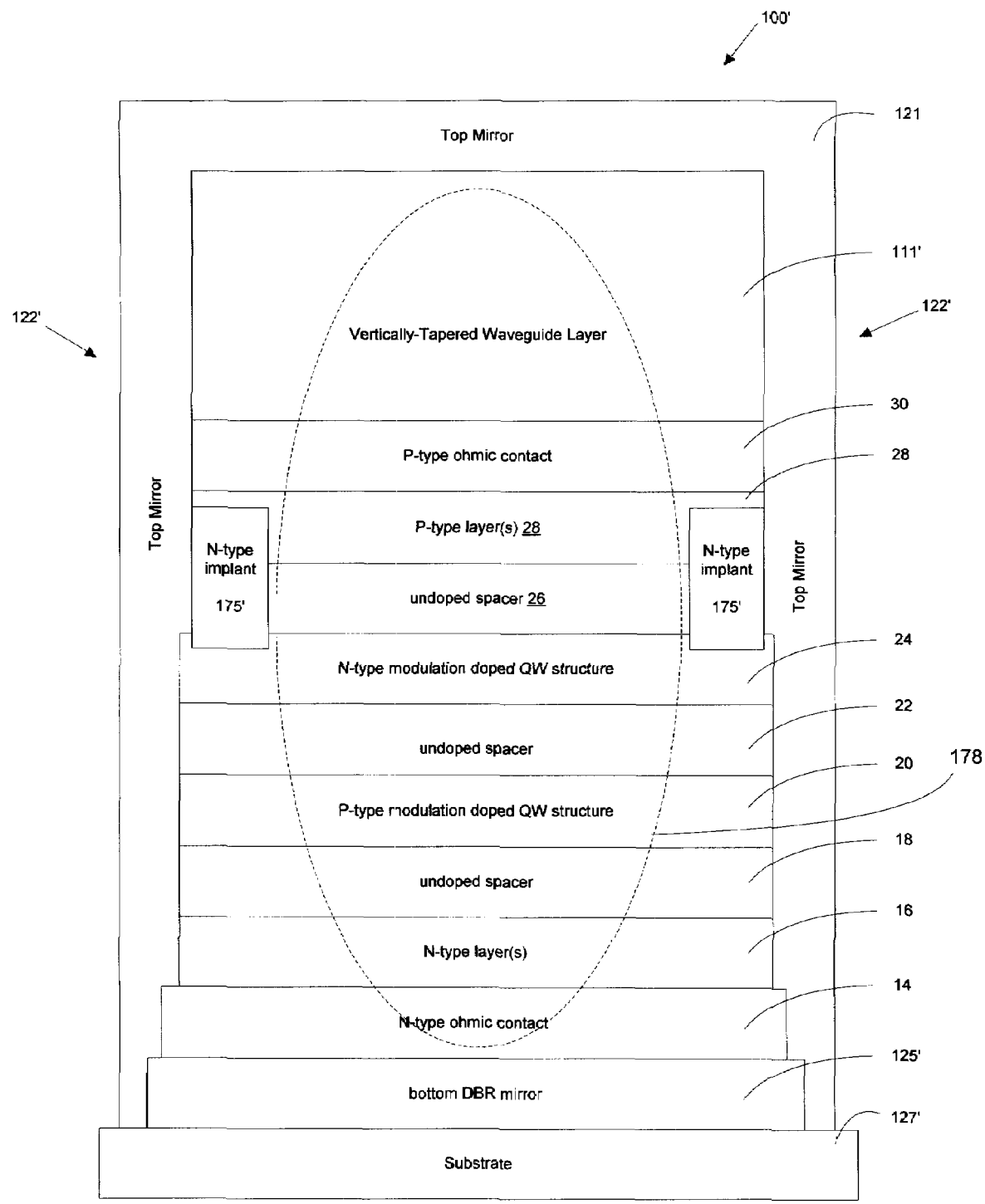

In an illustrative embodiment, the photonic integrated circuit of the present invention includes an active device 120' as schematically depicted in FIG. 2A integrally formed with a spot-size converter waveguide device 100' as schematically depicted in FIG. 2B. Both devices include a bottom dielectric distributed bragg reflector (DBR) mirror 125' formed on a common substrate 127'. The bottom DBR mirror 125' typically is formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4n$) optical thickness, the reflections from each of the boundaries will be added in phase to produce a large amount of reflected light (e.g., a large reflection coefficient) at the particular center wavelength $\lambda_D$.

Deposited upon the bottom DBR mirror 125' is the active device structure which consists of two HFET devices. The first of these is a p-channel HFET 11 (comprising layers 14, 16, 18, 20 and 22) which has one or more p-type modulation doped quantum wells (QWs) and is positioned with the gate terminal on the lower side (i.e. on the bottom DBR mirror 125') and the collector terminal on the upper side. The second of these is an n-channel HFET 13 (comprising layers 22, 24, 26, 28, 30) which has one or more n-type modulation doped quantum wells (QWs) and is positioned with the gate terminal on the top side and the collector terminal on the lower side which is the collector of the p-channel HFET device. Therefore a non-inverted n-channel device is stacked upon an inverted p-channel device to form the active device structure.

The active device layer structure begins with n-type ohmic contact layer(s) 14 which enables the formation of ohmic contacts thereto. Deposited on layer 14 is one or more n-type layer(s) 16, which are made sufficiently thin to enable current flow therethrough during operation of optoelectronic/electronic devices realized from this structure. The thickness of layer(s) 16 may be adjusted to set the desired current gain of a p-type quantum-well-base bipolar transistor realized from this structure as described in U.S. Pat. No. 6,841,795, commonly assigned to assignee of the present invention and herein incorporated by reference in its entirety. Preferably, the doping of layer(s) 16 is such that it should not be depleted in any range of operation of the device, i.e. the total doping in this layer should exceed the total doping charge contained in the modulation doped layer of the p-type modulation doped QW structure 20 described below. In this configuration, layer 14 achieves low contact resistance and layer 16 defines the capacitance of the p-channel HFET 11 with respect to the p-type modulation doped QW structure 20. This layer 16 also serves optically as a small part of the lower waveguide cladding for optical devices realized in this structure. Note that a majority of the lower waveguide cladding is provided by the lower DBR mirror 125' itself. The layer(s) 16 can also serve as an etch stop layer for contacting the contact layer(s) 14 as described in U.S. Pat. No. 6,841,795, which is incorporated by reference above. Deposited on layer(s) 16 is one or more undoped layers 18. The undoped layer(s) 18 preferably includes a thin undoped capping layer (which serves to prevent oxidation of layer 16 during subsequent manufacturing operations) and an undoped spacer layer. Layers 14, 16 and 18 serve electrically as part of the gate of the p-channel HFET 11. Deposited on layer 18 is a p-type modulation doped QW structure 20 that defines one or more quantum wells (which may be formed from strained or unstrained heterojunction materials). Deposited on the p-type modulation doped QW structure 20 is one or more undoped spacer layers 22, which forms the collector of the P-channel HFET device 11. All of the layers grown thus far form the P-channel HFET device 11 with the gate ohmic contact on the bottom.

Undoped spacer layer(s) 22 also forms the collector region of the N-channel HFET device 13. Deposited on layer(s) 22 is an n-type modulation doped QW structure 24 that defines one or more quantum wells (which may be formed from strained or unstrained heterojunction materials). Deposited on the n-type modulation doped QW structure 24 is one or more undoped layers 26, which preferably includes an undoped spacer layer and a thin undoped capping layer. The capping layer serves to prevent oxidation of spacer layer during subsequent manufacturing operations. Deposited on layer(s) 26 is a p-type layer structure 28, which is made sufficiently thin to enable current flow therethrough during operation of optoelectronic/electronic devices realized from this structure. The thickness of layer structure 28 may be adjusted to set the desired current gain of an n-type quantum-well-base bipolar transistor realized from this structure as described in U.S. Pat. No. 6,841,795. Preferably, the doping of the layer structure 28 is such that it should not be depleted in any range of operation of the device, i.e. the total doping in this layer should exceed the total doping charge contained in the modulation doped layer of the n-type modulation doped QW structure 24 described above. Layer structure 28 also serves optically as a small part of the upper waveguide cladding for optical devices realized in this structure. Note that a majority of the upper waveguide cladding is provided by the upper mirror (not shown). Layer structure 28 can also serve as an etch stop layer when forming contacts to the n-type inversion channel(s) of the NHFET device 13 as described in U.S. Pat. No. 6,841,795. Deposited on the layer structure 28 is a p-type ohmic contact layer(s) 30 which enables the formation of ohmic contacts thereto. Layers 26, 28 and 30 serve electrically as part of the gate of the n-channel HFET 13. In this configuration, layer 30 achieves low contact resistance and layer structure 28 defines the capacitance of the n-channel HFET 13 with respect to the n-type modulation doped QW structure 24.

Alternatively, the active device layer structure may be described as a pair of stacked quantum-well-base bipolar transistors formed on the bottom DBR mirror 125'. The first of these is an n-type quantum-well-base bipolar transistor (comprising layers 14, 16, 18, 20 and 22) which has one or more p-type modulation doped quantum wells and is positioned with the emitter terminal on the lower side (i.e. on the mirror as just described) and the collector terminal on the upper side. The second of these is an n-type quantum-well-base bipolar transistor (comprising layers 22, 24, 26, 28, 30) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the gate terminal of the p-channel HFET device 11 corresponds to the emitter terminal of the p-type quantum-well-base bipolar transistor, the p-type QW structure 20 corresponds to the base region of the p-type quantum-well-base bipolar transistor, spacer layer 22 corresponds to the collector region of both the p-type quantum-well-base bipolar transistor and the n-type quantum-well-base bipolar transistor, the n-type QW structure 24 corresponds to the base region of the n-type quantum-well-base bipolar transistor, and the gate terminal of the n-channel HFET device 13 corresponds to the emitter electrode of the n-type quantum-well-base bipolar transistor.

To form a resonant cavity device where light is input into and emitted from the device laterally (i.e., from a direction normal to the cross section of FIG. 2A), a diffraction grating 32 and top mirror 121' are formed over the active device layer structure described above. For vertical cavity lasing devices, the diffraction grating 32 performs the function of diffracting light produced by the vertical cavity into light propagating laterally in a waveguide region 177', which has the top mirror 121' and bottom DBR mirror 125' as waveguide cladding layers and which has lateral confinement regions defined by n-type ion implant regions 175' as shown, For vertical cavity detecting devices, the diffraction grating 32 performs the function of diffracting incident light that is propagating in the lateral direction along the waveguide region 177' into the vertical cavity mode, where it is absorbed resonantly in the vertical cavity. The top mirror 121' covers the sidewalls of the thyristor device 120' as shown schematically in FIG. 2A, which provides high-reflectivity sidewall cladding for lateral confinement of light therebetween.

The distance between the top mirror 121' and bottom DBR mirror 125' preferably represents an integral number of ½ wavelengths at the designated wavelength. This distance is controlled by adjusting the thickness of one or more of the layers therebetween to enable this condition.

The multilayer structure of FIG. 2A can be used to realize various active devices, including a thyristor device as shown. The thyristor device includes one or more anode terminal electrodes (one shown as 36) which are operably coupled to the p-type ohmic contact layer 30, one or more n-channel injector terminal electrodes (one shown as 3) which are operably coupled to the n-type QW structure 24, and one or more cathode terminal electrodes (one shown as 40) which are operably coupled to the n-type ohmic contact layer 14. The N-channel injector terminal(s) 38, which are coupled to the n-type inversion QW structure 24, is/are used control charge in such n-type inversion QW channel(s). In an alternative embodiment, one or more p-channel injector terminal electrodes (not shown) can be operably coupled to the p-type QW structure 20. In such a configuration, the p-channel injector terminal(s) is/are used to control charge in such p-type inversion QW channel(s). In yet another alternative embodiment, the N-channel injector terminals may be omitted and substituted by such p-channel injector terminal electrode(s). The thyristor device can be configured to carry out a number of diverse photonic functions, including the functionality of an optical detector, a vertical cavity laser emitter, an optical amplifier, a sampling switch and others.

FIGS. 2C1 and 2C2 illustrate the operational characteristics of the thyristor device configured as an optical detector. The thyristor device switches from a non-conducting/OFF state (where the current I is substantially zero) to a conducting/ON state (where current I is substantially greater than zero) when: i) the anode terminal 36 is forward biased (e.g. biased positively) with respect to the cathode terminal 40; and ii) absorption of optical energy in the QW channel(s) of N-type modulation doped QW structure 24 and/or injection of electrical energy into the QW channel(s) of N-type modulation doped QW structure 24 produce a charge in the N-type modulation doped QW structure 24 that is greater than the critical switching charge $Q_{CR}$, which is that charge that reduces the forward breakdown voltage such that no off state bias point exists. The critical switching charge $Q_{CR}$ is unique to the geometries and doping levels of the device. The forward breakdown voltage of the device varies over the injector current $I_g$.

The thyristor device switches from the conducting/ON state to a non-conducting/OFF state when the current I through the device falls below the hold current $I_H$ of the device for a sufficient period of time such that the charge in the N-type modulation doped QW structure 24 decreases below the holding charge $Q_H$. The holding charge $Q_H$ is the critical value of the channel charge which will sustain holding action.

The thyristor device is configured to convert an input digital optical signal to an output digital electrical signal as follows. The input digital optical signal encodes bits of information (each bit representing an OFF logic level or ON logic level) and is part of the Optical IN signal that is resonantly absorbed by the device. A sampling clock defines sampling periods that overlap the bits (e.g., ON/OFF pulse durations) in the input digital optical signal. In FIG. 2C1, the sampling clock is in the form of downward running electrical pulses (e.g., pulses wherein the relative voltage between the start of the pulse and the peak of the pulse is less than zero) supplied to the injector terminal 38. Alternatively, as shown in FIG. 2C2, the sampling clock is in the form of optical pulses that are part of the Optical IN signal that is resonantly absorbed by the device. In addition, the device is biased (preferably, by selecting the appropriate load resistance/voltage divider network as shown in FIGS. 2C1 and 2C2) such that the current I through the device in the ON state is substantially greater than zero but substantially below the threshold current for lasing $I_L$ (preferably about one-third of $I_L$). In addition, the injector terminal 38 is forward biased with respect to the anode terminal 36 through a current source that generates a bias current $I_{BIAS}$ as shown.

As previously mentioned, in an alternate embodiment, the injector terminal 38 of the thyristor device may be operably coupled to the p-type QW channel(s) realized in the P-type modulation doped QW(s) structure 20. In such a configuration, the electrical sampling clock of FIG. 2C1 is in the form of upward running electrical pulses (e.g., pulses wherein the relative voltage between the start of the pulse and the peak of the pulse is greater than zero) supplied to the injector terminal of the device. In addition, the bias current source would be adapted to draw charge from the p-type QW channel(s) to ground potential.

Also, as previously mentioned, in another alternative embodiment, a first injector terminal may be operably coupled to the n-type QW channel(s) realized in the N-type modulation doped QW structure 24 while a second injector terminal is operably coupled to the p-type QW channel(s) in the P-type modulation doped QW(s) structure 20. In such a configuration, the electrical sampling clock supplied to the p-type QW channel(s) is in the form of upward running electrical pulses (e.g., pulses wherein the relative voltage between the start of the pulse and the peak of the pulse is greater than zero) supplied to the second injector terminal of the device. In addition, the bias current source operably coupled to the p-type QW channel(s) draws charge from the p-type QW channel(s) to ground potential.

As shown in FIG. 2C3, the thyristor device may also be configured as a vertical cavity laser emitter. In this configuration, the thyristor device is biased (preferably, by selection of load resistance operably coupled between the cathode terminal 40 and ground potential) such that the current I flowing the through the device in the conducting/ON state is above the lasing threshold $I_L$. The conducting-ON state is controlled by injection of an electrical control signal supplied to the injector terminal 38 (and/or by absorption of an optical control signal incident on the device) which causes charge to build up in the QW channel(s) of the device sufficient to induce a change in current flowing through the device from the anode terminal 36 to the cathode terminal 40.

The thyristor device of FIG. 2A can also be configured to operate as an optically-controlled (or electrically-controlled) sampling device (e.g., sampling switch) wherein an input terminal is selectively coupled to an output terminal in response to an optical control signal (or an electrical control signal). The input terminal and output terminal correspond to the n-channel injector terminal pair (or p-channel injector terminal pair) of the device shown in FIG. 2A. For optical control, the thyristor device is biased such that the optical control signal is resonantly absorbed by the device and switches the device between the ON state/OFF state. For electrical control, the thyristor device is biased such that the electrical control signal is injected into the QW channel(s) of the device and switches the device between the ON state/OFF state. In the ON state, the n-channel injector terminal pair (or p-channel injector terminal pair) is operably coupled together (with minimal potential voltage difference therebetween). In the OFF state, the n-channel injector terminal pair (or p-channel injector terminal pair) is electrically isolated from one another.

In addition, the thyristor device of FIG. 2A can be configured to operate as various other optoelectronic components including a digital optical modulator and optical amplifier as described below.

A digital optical modulator operates in one of two distinct optical states in modulating an input optical signal. In optical state 1, there is substantially no loss to the input optical signal via absorption. In optical state 2, substantially all of the input optical signal is absorbed. To configure the thyristor device as a digital optical modulator, an optical path is provided through the device either vertically or in the waveguide mode, and an input signal is applied to the injector terminal 38. When the input signal produces a forward bias between the injector terminal 38 and the anode terminal 36 sufficient to produce charge in the QW channel(s) of the device greater than the critical switching charge $Q_{CR}$, the thyristor device operates in its conducting/ON state. The device is biased such that the current I through the device in the ON state is substantially below the threshold for lasing (preferably about 0.5 to 0.7 of the lasing threshold current). In this configuration, in the ON state, the device operates in optical state 1 whereby there is substantially no loss to the input optical signal via absorption. When the input signal produces a reverse bias between the injector terminal 38 and the anode terminal 36, charge is drawn from the injector terminal 38 such that the channel charge in the QW channel(s) of the device falls below the hold charge $Q_H$, and the thyristor device operates in its non-conducting/OFF state. In the OFF state, the device operates in optical state 2 whereby substantially all of the input optical signal is absorbed. Preferably, the digital optical modulator includes a diffraction grating as described above. This grating enhances the absorption and enables modulation between the 0 and 1 states in the shortest possible length.

An optical amplifier amplifies an input optical signal to produce a corresponding output optical signal with an increased intensity level. To configure the thyristor device as an optical amplifier, a forward bias is applied between the injector terminal 38 and cathode terminal 40, and a forward bias is applied between the anode terminal 36 and cathode terminal 40 through a load resistance $R_L$ that sets the current I in the ON state at a point substantially below lasing threshold $I_L$. In this configuration, in the ON state, the device amplifies an input optical signal to produce a corresponding output optical signal with an increased intensity level. The optical amplifier may be switched into and out of the ON state by applying forward and reverse biases to the injector terminal 38 with respect to the anode terminal 36 as described above. The gain of the optical amplifier in the ON state and thus the output signal intensity level may be changed by adjusting the current I in the ON state. Preferably, the optical amplifier operates without the existence of a diffraction grating in the structure. In this configuration, there will be no interaction between the waveguide traveling wave and the vertical cavity oscillation. The gain is obtained by using the high density of electrons and holes in the vertical laser above threshold.

The multilayer structure of FIG. 2A can also be used to realize various other active devices, including a PIN detector and analog optical modulator as described below.

A PIN detector generates an electrical signal proportional to the optical signal incident thereon. To configure the multilayer structure of FIG. 2A as a PIN detector, the n-type ohmic contact layer (which is coupled to the cathode terminal 40 of the thyristor device) floats electrically and a reverse bias is applied between the p-type ohmic contact layer 30 (which is coupled to the anode terminal 36 of the thyristor device) and the n-channel injector terminal(s) 38. Such a configuration creates a reverse-bias PIN junction that generates an electrical signal (photocurrent) proportional to the optical signal incident to the vertical cavity. Preferably, the PIN detector incorporates a diffraction grating for efficient operation.

An analog optical modulator modulates an input optical signal linearly over a range of modulation values. To configure the multilayer structure of FIG. 2A as an analog optical modulator, the n-type ohmic contact layer (which is coupled to the cathode terminal 40 of the thyristor device) floats electrically. Similar to the thyristor device, an optical path is provided through the device either vertically or in the waveguide mode, and an input signal is applied to the anode terminal 36 with respect to the injector terminal(s) 38 such that the anode terminal 36 is biased positively with respect to the injector terminal(s) 38. In this configuration, the voltage at the anode terminal 36 is varied over a range of voltage levels where absorption of the device varies linearly. The top of the voltage range (where minimum absorption occurs) is defined by the operation point where conduction occurs from the anode terminal 36 to the injector terminal(s) 38. Preferably, the analog modulator incorporates a diffraction grating for efficient operation.

As shown in FIG. 2B, the spot-size converter waveguide device 100' includes a combination of several mesas, which include substantially-vertical surfaces (sidewalls) and substantially-horizontal surfaces formed in the active device layer structure (layers 14-30) between the top mirror 121' and the bottom DBR mirror 125' to provide for guiding of light therein. A vertically-tapered waveguide layer 111' is formed over the top mesa of the active device layer structure along the length of the waveguide device 100 in a manner similar to that shown in FIG. 1B. The top mirror 121' is formed continuously over the vertically-tapered waveguide layer 111' to impart a vertical taper to the top mirror 121' as it extends along the length of the waveguide device 100'. The sidewalls 122' of the waveguide device 100' are laterally tapered along the length of the waveguide device 100' in a manner similar to that shown in FIG. 1A. The top mirror 121' is formed continuously over the device to cover the laterally-tapered sidewalls 122' to thereby realize a laterally-tapered mirror that overlies the sidewalls of the waveguide device 100' over it length. The vertically-tapered top mirror 121' and the bottom DBR mirror 125' provide for vertical confinement of light along the length of the waveguide device 100', while the laterally-tapered mirror 121' that covers the sidewalls of the device provide for lateral confinement of light along the length of the waveguide device 100'. The vertical and lateral tapered design of the waveguide device 100' transforms the mode of light along the waveguide device from a larger-size mode at one end to a smaller-size mode at the other end adjacent the active device. The smaller-size mode substantially conforms to and is aligned with the active waveguide region 177 of the active device 120. This limits optical loss in coupling the active device 120' to an off-chip larger-size optical element (e.g., fiber or free-space optics). The mode size along the waveguide device 100' conforms to a waveguide region 178' as shown, which tapers vertically and laterally along the waveguide device 100' in accordance with its vertical and lateral tapered design. In the preferred embodiment, the lateral and vertical tapered design of the waveguide device 100 transforms the spot-size in a gradual "adiabatic" manner, which is designed to keep all optical power in one mode during propagation therethrough.

The spot-size converter waveguide device 100' of FIG. 2B preferably includes n-type implant regions 175' that extend downward between layers 28 and 24 adjacent the laterally-tapered sidewalls along a portion of the length of the waveguide device with the waveguide region 178' therebetween. In the preferred embodiment, the n-type implant regions 175' extend along the length of the active thyristor device 120' of FIG. 2A and continue along at least a portion of the spot-size converter waveguide device 100' that is adjacent the active thyristor device 120' (and possibly along the entire spot-size converter waveguide device 100' in a manner similar to the design of FIG. 1A). This feature ensures that the waveguide region 178' of the spot-size converter waveguide device 100' is substantially aligned in the lateral directions relative to the waveguide region 177' of the active thyristor device 120' at the interface therebetween, which minimizes coupling losses.

The photonic integrated circuit realized from the multilayer structures of FIGS. 2A and 2B can also include various transistor devices integrated therein, including n-channel HFET devices, p-channel HFET devices, p-type quantum-well-base bipolar transistor devices and n-type quantum-well-base bipolar transistor devices. Such devices are described in detail in U.S. Pat. No. 6,841,795.

In an n-channel HFET, ohmic metal source and drain electrodes are electrically coupled to spaced apart N-type implants, which are electrically coupled to the n-type QW structure 24 to form a channel region there between. An ohmic metal gate electrode is formed on the p-type ohmic contact layer 30 and covers the channel region. An ohmic metal collector electrode is electrically coupled to at least one P-type implant, which is electrically coupled to the p-type QW structure 20 below the channel region.

In a p-channel HFET, ohmic metal source and drain electrodes are electrically coupled to spaced apart p-type implants, which are electrically coupled to the p-type QW structure 20 to form a channel region there between. Outside the channel region, an ohmic metal gate electrode is deposited on the n-type ohmic contact layer 14. An n-type implant is deposited above layer 22 and preferably into layer 24. An ohmic metal collector electrode is formed on the n-type implant.

In a p-type quantum-well-base bipolar transistor device, one or more base electrodes are electrically coupled to spaced apart P-type implants, which are electrically coupled to the p-type QW structure 20. Outside the p-type implants, one or more emitter electrodes are deposited on the n-type ohmic contact layer 14. A collector electrode is electrically coupled to an n-type implant, which is electrically coupled to the n-type QW structure 24. An additional collector electrode may be electrically coupled to another n-type implant into the p-type material of layer 28 or into the undoped spacer 26.

In an n-type quantum-well-base bipolar transistor device, one or more base electrodes are electrically coupled to spaced apart n-type implants, which are electrically coupled to the n-type QW structure 24. One or more collector electrodes are electrically coupled to corresponding p-type implants, which are electrically coupled to the p-type QW structure 20. An emitter electrode is deposited on the n-type ohmic contact layer 30.

The multilayer structures of FIGS. 2A and 2B are preferably realized with a material system based on group III-V materials (such as a GaAs/AlGaAs). FIG. 3A illustrates an exemplary epitaxial growth structure utilizing group III-V materials for realizing the multilayer structure of FIGS. 2A and 2B.

The structures of FIG. 3A can be made, for example, using known molecular beam epitaxy (MBE) techniques. As shown, a first semiconductor layer 151 of AlAs and a second semiconductor layer 152 of GaAs are alternately deposited (with preferably at least seven pairs) upon a semi-insulating gallium arsenide substrate 149 in sequence to form the bottom distributed bragg reflector (DBR) mirror 125'. The number of AlAs layers will preferably always be one greater than the number of GaAs layers so that the first and last layers of the mirror are shown as layer 151. In the preferred embodiment the AlAs layers 151 are subjected to high temperature steam oxidation to produce the compound $Al_xO_y$, so that a mirror will be formed at the designed center wavelength. This center wavelength is selected such that all of the resonant wavelengths for the various cavities of the array will be subject to high reflectivity. Therefore the thicknesses of layers 151 and 152 in the mirror are chosen so that the final optical thickness of GaAs and $Al_xO_y$ are one quarter wavelength of the center wavelength $\lambda_D$. Alternatively the mirrors could be grown as alternating layers of one-quarter wavelength thickness of GaAs and AlAs at the designed wavelength so that the oxidation step is not used. In that case, many more pairs are required (with typical numbers such as 22 pairs) to achieve the reflectivity needed for efficient lasing.

Deposited upon the mirror is the active device structure which consists of two HFET devices. The first of these is the p-channel HFET (PHFET) 11, which has one or more p-type modulation doped quantum wells and is positioned with the gate terminal on the bottom (i.e. on the mirror 125' just described) and the collector terminal above. The second of these is an n-channel HFET (NHFET) 13, which has one or more n-type modulation doped quantum wells and is positioned with the gate terminal on top and the collector terminal below. The collector region of the NHFET device 13 also functions as the collector region of the PHFET device 11. However, the collector terminal of the NHFET device 13 is a p-type contact to p-type quantum well(s) disposed below (above) the collector region, while the collector terminal of the PHFET device 11 is an n-type contact to n-type quantum well(s) disposed above the collector region. Therefore a non-inverted n-channel device is stacked upon an inverted p-channel device to form the active device layer structure.

The active device layer structure begins with layer 153 of N+ type GaAs that enables the formation of ohmic contacts thereto (for example, when contacting to the emitter terminal of a p-type quantum-well-base bipolar device, the cathode terminal of a thyristor device, the gate terminal of an inverted p-channel HFET device, or the sub-collector terminal of an n-channel HFET device). Layer 153 has a typical thickness of 1000-3000 Å and a typical n-type doping of $3.5 \times 10^{18}$ cm$^{-3}$. The N+ doped GaAs layer 153 corresponds to the ohmic contact layer 14 of FIG. 2A. Deposited on layer 153 is layer 154 of n-type $Al_{x1}Ga_{1-x1}As$ with a typical thickness of 500-3000 Å and a typical doping of $1 \times 10^{17}$ cm$^{-3}$. The parameter x1 is preferably in the range between 70% and 80% for layer 154. This layer serves as part of the PHFET gate and optically as a small part of the lower waveguide cladding of the device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. Next are four layers (155a, 155b, 155c, and 155d) of $Al_{x2}Ga_{1-x2}As$. These four layers (collectively, 155) have a total thickness about 380-500 Å and where x2 is about 15%. The first layer 155a is about 60-80 Å thick and is doped N+ type in the form of delta doping with a typical n-type doping of $3.5\times10^{18}$ cm$^{-3}$. The second layer 155b is about 200-300 Å thick and is undoped. The third layer 155c is about 80 Å thick and is doped P+ type in the form of delta doping with a typical p-type doping of $3.5\times10^{18}$ cm$^{-3}$. The fourth layer 155d is about 20-30 Å thick and is undoped to form a spacer layer. This layer forms the lower separate confinement heterostructure (SCH) layer for the laser, amplifier and modulator devices. The n-type AlGaAs layer 154 and n-type AlGaAs layer 155a correspond to the n-type layer(s) 16 of FIG. 2A, and the undoped AlGaAs layer 155b corresponds to the undoped spacer layer 18 of FIG. 2A.

The next layers define the quantum well(s) that form the inversion channel(s) during operation of the PHFET 11. For a strained quantum well, this includes a spacer layer 156 of undoped GaAs that is about 10-25 Å thick and then combinations of a quantum well layer 157 that is about 40-80 Å thick and a barrier layer 158 of undoped GaAs. The quantum well layer 157 may be comprised of a range of compositions. In the preferred embodiment, the quantum well is formed from an In$_{0.2}$Ga$_{0.8}$AsN composition with the nitrogen content varying from 0% to 5% depending upon the desired natural emission frequency. Thus, for a natural emission frequency of 0.98 µm, the nitrogen content will be 0%; for a natural emission frequency of 1.3 µm, the nitrogen content will be approximately 2%; and for a natural emission frequency of 1.5 µm, the nitrogen content will be approximately 4-5%. The well barrier combination will typically be repeated (for example, three times as shown), however single quantum well structures may also be used. Unstrained quantum wells are also possible. Following the last barrier of undoped GaAs is a layer 159 of undoped Al$_{x2}$Ga$_{1-x2}$As which serves electrically as part of the collector of the PHFET device 11 and is about 0.5 µm in thickness. All of the layers grown thus far form the PHFET device 11 with the gate contact on the bottom. The layers between the P+ AlGaAs layer 155c and the last undoped GaAs barrier layer 158 correspond to the p-type modulation doped heterojunction QW structure 20 of FIG. 2A. Undoped AlGaAs layer 159 corresponds to the undoped spacer layer 22 of FIG. 2A.

Layer 159 also serves electrically as part of the collector of the NHFET device 13. Deposited on layer 159 are two layers (collectively 160) of undoped GaAs of about 200-250 Å total thickness, which form the barrier of the first n-type quantum well. Layer 160 is thicker than the normal barrier layer of about 100 Å because it accommodates the growth interruption to change the growth temperature from 610° C. (as required for optical quality Al$_{x2}$Ga$_{1-x2}$As layers) to about 530° C. for the growth of InGaAs. Therefore layer 160 includes a single layer 160a of about 150 Å and a barrier layer 160b of about 100 Å. The next layer 161 is the quantum well of In$_{0.2}$Ga$_{0.8}$As, which is undoped and about 40-80 Å in thickness. It is noted that the n-type quantum well layer 161 need not be of the same formulation as the p-type quantum well layer 157. The barrier layer 160b of 100 Å and quantum well layer 161 may be repeated, e.g., three times. Then there is a barrier layer 162 of about 10-30 Å of undoped GaAs which accommodates a growth interruption and a change of growth temperature. Next there are four layers (collectively 163) of Al$_{x2}$Ga$_{1-x2}$As of about 300-500 Å total thickness. These four layers (163) include a spacer layer 163a of undoped Al$_{x2}$Ga$_{1-x2}$As that is about 20-30 Å thick, a modulation doped layer 163b of N+ type doping of Al$_{x2}$Ga$_{1-x2}$As (with doping about $3.5\times10^{18}$ cm$^{-3}$) that is about 80 Å thick, a spacer layer 163c of undoped Al$_{x2}$Ga$_{1-x2}$As that is about 200-300 Å thick, and a P+ type delta doped layer 163d of Al$_{x2}$Ga$_{1-x2}$As (with doping about $3.5\times10^{18}$ cm$^{-3}$) that is about 60-80 Å in thickness. Layers 163b and 163d form the top plate and bottom plate of a parallel plate capacitor which forms the field-effect input to all active devices. The doping species for layer 163d is preferably carbon (C) to ensure diffusive stability. In contrast to layer 163b which is always depleted, layer 163d should never be totally depleted in operation. For the optoelectronic device operation, layer 163 is the upper SCH region. The layers between the undoped GaAs barrier layer 160a and the N+ AlGaAs layer 163b provide an n-type modulation doped heterojunction QW structure 24. Undoped AlGaAs layer 163c corresponds to the undoped spacer layer 26 of FIG. 2A.

One or more layers (collectively 164) of p-type Al$_{x1}$Ga$_{1-x1}$As are deposited next to form part of the upper waveguide cladding for the laser, amplifier and modulator devices. Note that a majority of the upper waveguide cladding for waves propagating in the waveguide 177" of the device is provided by a top mirror as described below. Preferably, layer 164 has a thickness on the order of 500-1500 Å, and includes a first thin sublayer 164a that is 10-20 Å thick and has a P+ doping of $10^{19}$ cm$^{-3}$ and a second sublayer 164b that is 700 Å thick and has a P doping of $1\times10^{17}$-$5\times10^{17}$ cm$^{-3}$. The parameter x1 of layer 164 is preferably about 70%.

Deposited next is an ohmic contact layer 165 (which may comprise a single layer of GaAs or a combination of GaAs (165a) and InGaAs (165b) as shown). Layer 165 is about 50-100 Å thick and is doped to a very high level of P+ type doping (about $1\times10^{20}$ cm$^{-3}$) to enable formation of ohmic contacts thereto (for example, when contacting to the anode terminal of a thyristor device).

Alternatively, the active device structure may be described as a pair of stacked quantum-well-base bipolar transistors formed on the bottom DBR mirror (layers 151/152). The first of these is an p-type quantum-well-base bipolar transistor (comprising layers 153 through 159) which has one or more p-type modulation doped quantum wells and is positioned with the emitter terminal on the lower side (i.e. on the bottom mirror as just described) and the collector terminal on the upper side. The second of these is an n-type quantum-well-base bipolar transistor (comprising layers 159 through 165b) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the bottom n-type layers (layers 153 through 155a) and the undoped spacer layer 155b serve electrically as part of the emitter of the p-type quantum-well-base bipolar transistor (as well as part of the cathode of a thyristor device), the p-type QW structure (layers 155c though 158) serves electrically as part of the base of the p-type quantum-well-base bipolar transistor, and spacer layer 159 serves electrically as part of the collector of the p-type quantum-well-base bipolar transistor (as well as part of the collection of an n-type quantum-well-base bipolar transistor). The n-type QW structure (layers 160a through 163b) serves electrically as part of the base of an n-type quantum-well-base bipolar transistor. The top p-type layers (layers 163d through 165b) and the undoped spacer layer 163c serve electrically as part of the emitter of the n-type quantum-well-base bipolar transistor as well as part of the anode of the thyristor device.

Figure 3B:
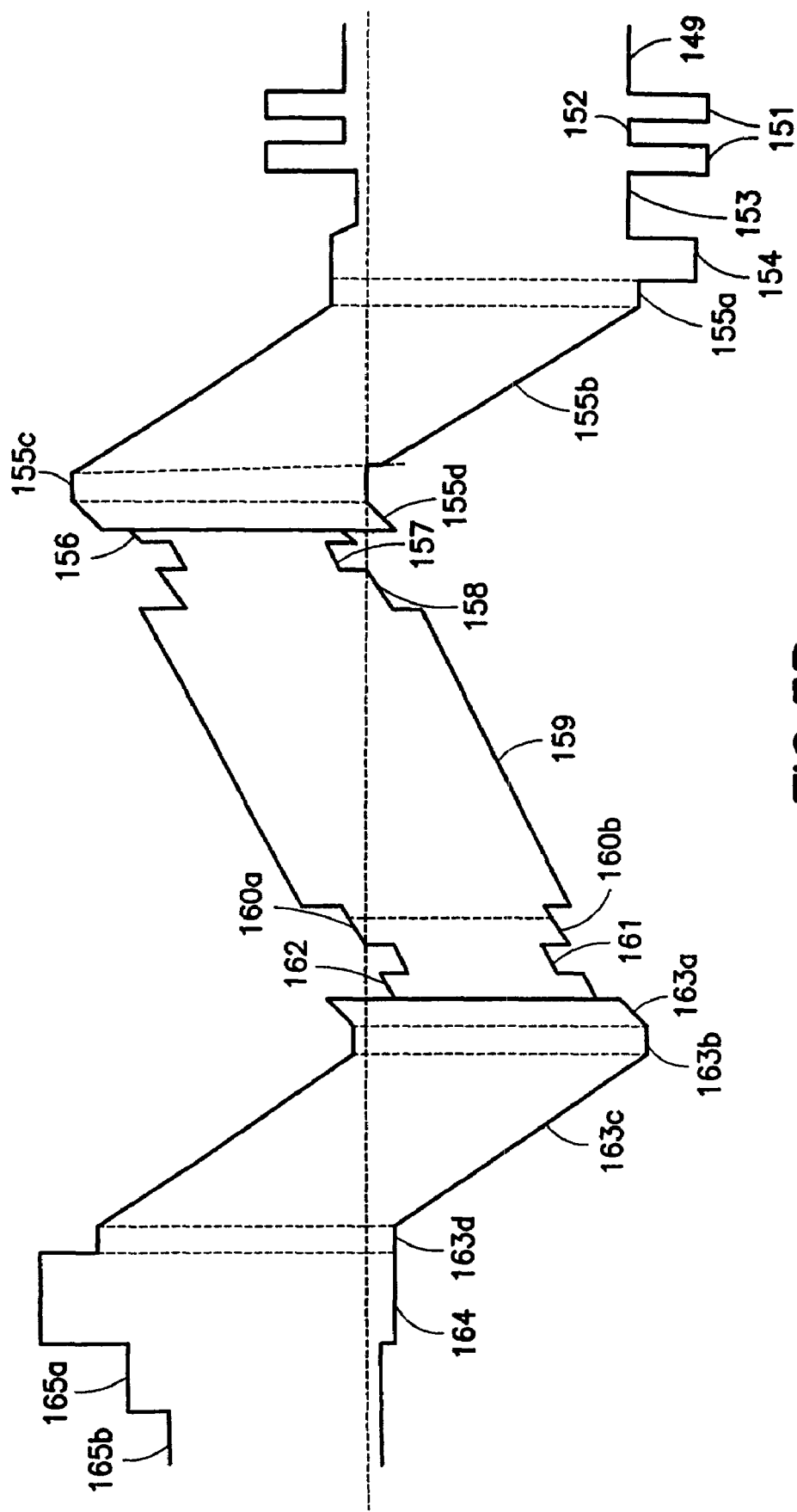
FIG. 3B depicts the spot-size converter device of the integrated circuit.

The energy bandgap diagram of the FIG. 3A structure is shown in FIG. 3B.

Figure 3C:
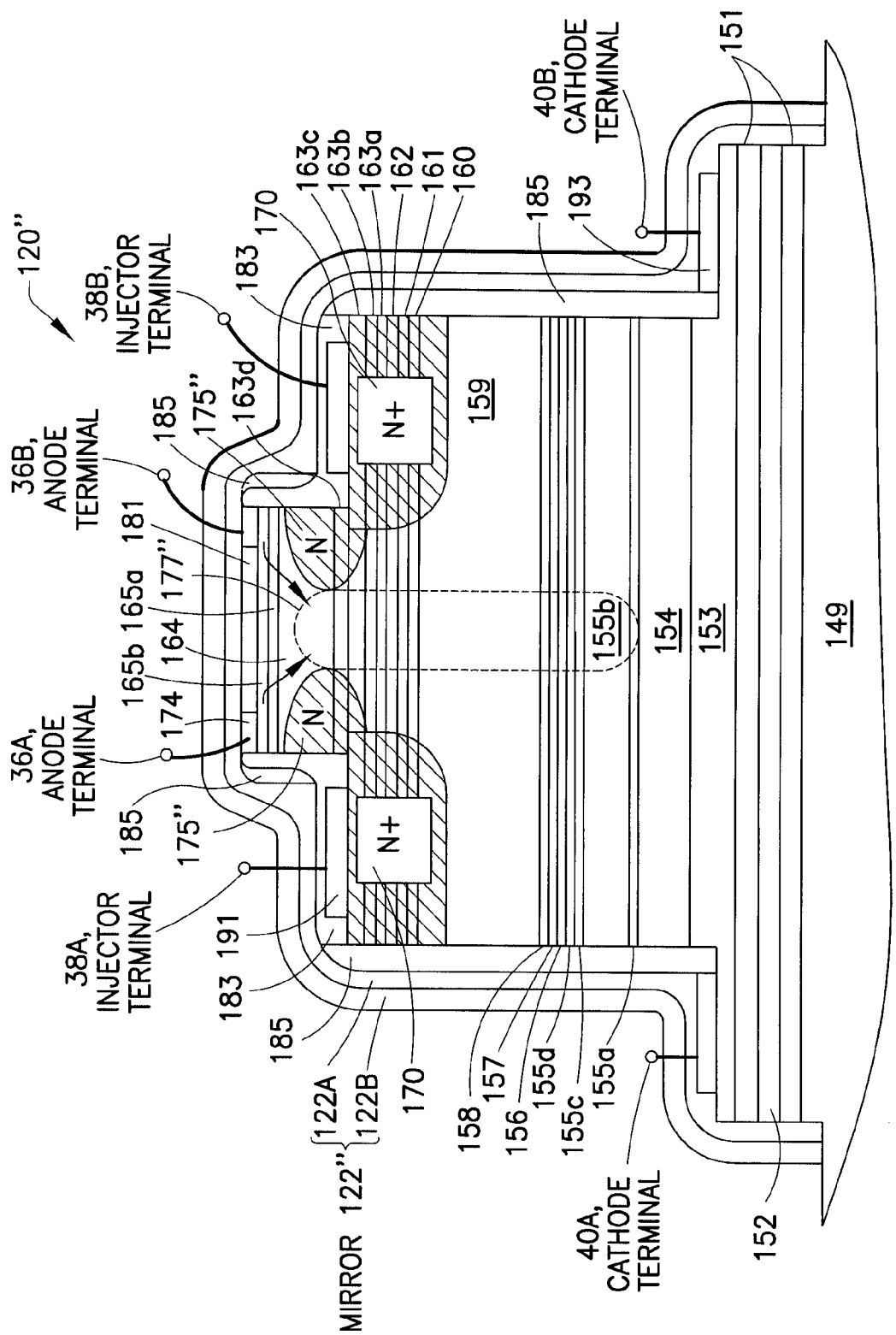
FIGS. 3C and 3D are cross-sectional schematics of an embodiment of an integrated circuit realized from the multilayer structure of FIGS. 3A and 3B in accordance with the present invention.

FIG. 3C illustrates an exemplary thyristor device 120" realized from the multilayer structure of FIGS. 3A and 3B. As shown, one or more anode terminal electrodes (two shown as 36A and 36B) are operably coupled to the p-type ohmic contact layer 30, one or more n-channel injector terminal electrodes (two shown as 38A, 38B) are operably coupled to the n-type QW structure 24, and one or more collector terminal electrodes (two shown as 40A, 40B) are operably coupled to the n-type ohmic contact layer 14. The N-channel injector terminals (38A, 38B), which are coupled to the n-type inversion QW structure 24, are used to control charge in such n-type inversion QW channel(s). In an alternative embodiment, one or more p-channel injector terminal electrodes can be operably coupled to the p-type QW structure 20. In such a configuration, the p-channel injector terminals are used to control charge in such p-type inversion QW channel(s). In yet another alternative embodiment, the N-channel injector terminals may be omitted and substituted by such p-channel injector terminal electrodes.

To form a resonant cavity device where light is input into and emitted from the device laterally, a diffraction grating (for example, as described in detail in U.S. Pat. No. 6,031,243) and top mirror (layers 122A, 122B) are formed over the active device structure described above. For vertical cavity lasing devices, the diffraction grating performs the function of diffracting light produced by the vertical cavity into light propagating laterally in a waveguide which has the mirror and bottom DBR mirror as waveguide cladding layers and which has lateral confinement regions (typically formed by implants as described herein in more detail). For vertical cavity detecting devices, the diffraction grating performs the function of diffracting incident light that is propagating in the lateral direction into the vertical cavity mode, where it is absorbed resonantly in the vertical cavity. The top mirror covers the sidewalls of the thyristor device 120" as shown, which provides high-reflectivity sidewall cladding for lateral confinement of light therebetween. The distance between the top mirror and bottom DBR mirror preferably represents an integral number of ½ wavelengths at the designated wavelength. Preferably, the thickness of layer 164 and/or layer 159 is adjusted to enable this condition.

Figure 3D:
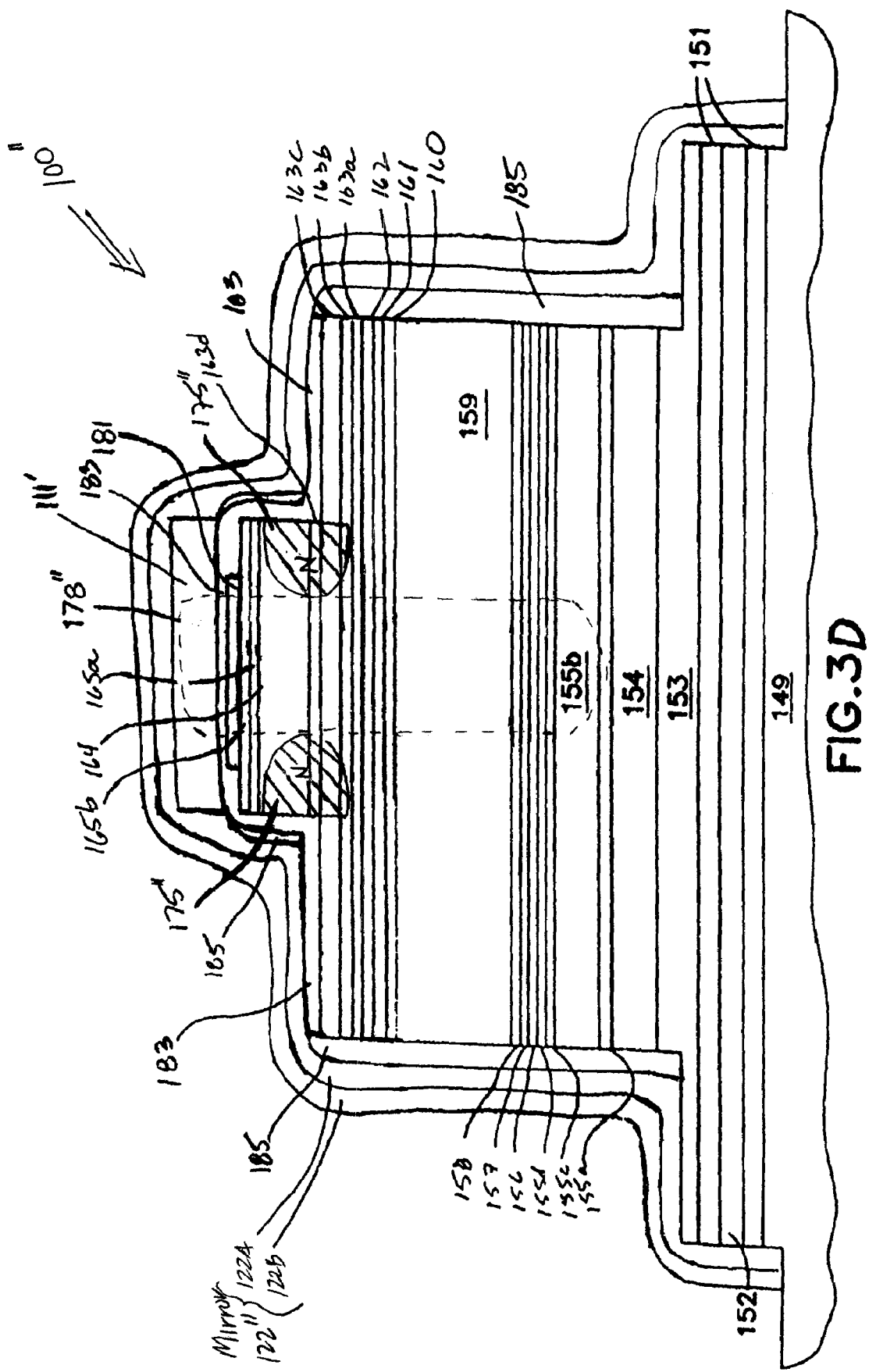
Figure 4:
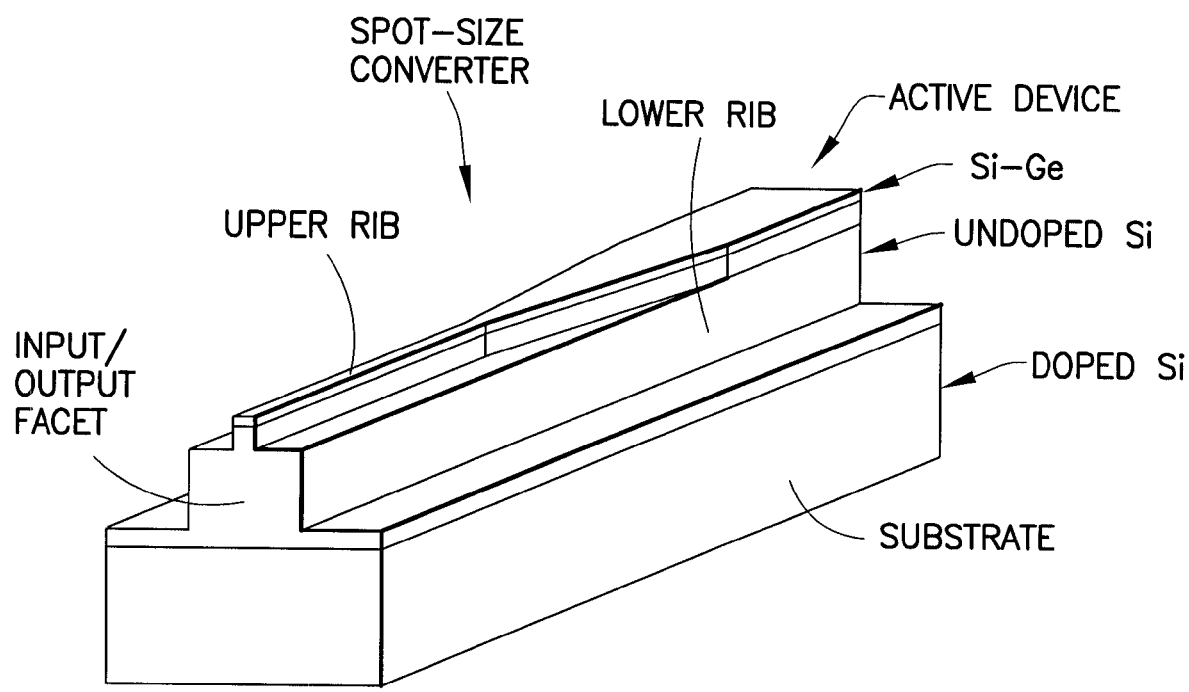
FIG. 4 is a schematic showing a prior art integrated circuit that employs a rib-on-rib spot-converter waveguide device.

FIG. 3D illustrates an exemplary spot-size converter waveguide device 100" realized from the multilayer structure of FIGS. 3A and 3B. The cross-section of FIG. 3D is disposed intermediate between the opposed ends of the waveguide device 100". As shown, the device includes a combination of several mesas, which include substantially vertical surfaces (sidewalls) and substantially horizontal surfaces formed in the multilayer structure between the top mirror (layers 122A, 122B) and the bottom DBR mirror (layers 151/152) to provide for guiding of light therein. A vertically-tapered waveguide layer 111" is formed over the top mesa structure of the waveguide device 100" along its length similar to the vertical taper design shown in FIG. 1B. The highly-reflective top mirror structure is formed continuously over the vertically-tapered waveguide layer 111" to thereby realize a vertically-tapered top mirror that extends along the length of the waveguide device 100". The sidewalls of the waveguide device 100" are tapered along its length similar to the taper design shown in FIG. 1A. The top mirror structure is formed continuously over the waveguide device 100" to cover the laterally-tapered sidewalls to thereby realize a laterally-tapered mirror that overlies the sidewalls of the waveguide device 100" over it length. The vertically-tapered top mirror and the bottom mirror provide for vertical confinement of light along the length of the waveguide device 100", while the laterally-tapered mirror structures that cover the sidewalls of the waveguide device 100" provide for lateral confinement of light along the length of the waveguide device 100". The vertical and lateral tapered design of the waveguide device 100" provides a waveguide region 178" that transforms the mode of light along the waveguide device from a larger-size mode at one end (e.g., the input/output facet 115 of FIGS. 1A and 1B) to a smaller-size mode at the other end, which substantially conforms to and is aligned with the waveguide region 177" of the thyristor device 120" of FIG. 3C. This limits optical loss in coupling the integrated thyristor device 100" of FIG. 3C to an off-chip larger-size optical element (e.g., fiber or free-space optics).

In order to integrate the thyristor device 120" of FIG. 3C and the spot-size converter waveguide device 100" of FIG. 3D together on the multilayer structure of FIG. 3A, alignment marks (not shown) are defined by etching, and then a cap layer 181 of silicon nitride or other suitable dielectric is deposited to act as protection for the surface layer and as a blocking layer for subsequent ion implants. Then an ion implant of n-type ions is performed, which form n-type implant regions 175" as shown in FIGS. 3C and 3D. An optical aperture is defined by the separation between the implant regions 175". The n-type implant regions 175" create a p-n junction in the layers between p-type top layers and the n-type modulation doped quantum well(s) structure 24, and the aperture between the implants defines the waveguide regions 177" and 178" of the respective devices. The cap layer 181 covers the waveguide region 177" for the thyristor device 120" as well as the waveguide region 178" for the spot-size converter waveguide device 100" as best shown in FIGS. 3C and 3D, respectively.

For the thyristor device 120" of FIG. 3C, the waveguide region 177" is optically active as current flows therethrough. The current cannot flow into the n-type implanted regions 175" because of the barrier to current injection. The current flow trajectory is shown in FIG. 3C as arrows. For lasing applications, the laser threshold condition is reached before the voltage for turn-on of this barrier. For the thyristor device of FIG. 3C, the n-type implant regions 175" extend opposite one another along the length of the thyristor device with the waveguide region 177" therebetween.

For the spot-size converter waveguide device 100" of FIG. 3D, the n-type implant regions 175" extend adjacent the laterally-tapered sidewalls along a portion of the length of the waveguide device with the waveguide region 178" therebetween. In the preferred embodiment, the n-type implant regions 175" extend along the length of the thyristor device and continue along at least a portion of the spot-size converter waveguide device that is adjacent the thyristor device (and possibly along the entire spot-size converter waveguide device in a manner similar to the design of FIG. 1A). This feature ensures that the waveguide region of the spot-size converter waveguide device is substantially aligned in the lateral directions relative to the waveguide region of the thyristor device at the interface therebetween, which minimizes coupling losses. In the event that the n-type implant regions 175" are omitted from portions of the spot-size converter waveguide device, the cap layer 181 can also be omitted for these portions and the waveguide region 178" may be expanded laterally for such portions.

Following the formation of the n-type implants 175", a metal layer 174 is deposited and defined to form anode terminals 36A and 36B (which collectively form the anode terminal 36) of the thyristor device 120" of FIG. 3C. The anode terminals 36A, 36B are disposed above the n-type implant regions 175" of the thyristor device and extend opposite one another along its length with the waveguide region 177" therebetween. Preferably, the metal layer 174 of the anode terminals 36A, 36B comprises a composite metal structure formed by depositing Nickel (Ni), Indium (In) and Tungsten (W) metals, which is transformed during an RTA operation as set forth below into a thermally-stable low resistance metal layer. Exemplary NiInW composite metal structures are described in Murakami et al., "Thermally stable ohmic contacts to n-type GaAs. VIII Sputter-deposited InAs contacts," J. Appl. Physics, Vol. 68, No. 5, 1990, pgs. 2475-2481; and Hallili et al., "Thermally stable ohmic contacts to n-type GaAs. IX. NiInW and NiIn(Mn)W Contact Metals," J. Appl. Physics, Vol. 70, No. 12, 1991, pgs. 7443-7448. Such composite metal structures include an InAs/W multilayer structure, an InAs/Ni/W multilayer structure, an Ni/InAs/Ni/W multilayer structure, and Ni/Ni—In/Ni/W multilayer structure (where the Ni—In layer is formed by codeposition of Ni and In). In the preferred embodiment of the present invention, the same composite metal structure is used to form low resistance metal contact layers to both the n-type and p-type conduction channels of the device.

Next, patterning and etching operations are performed that expose a first pair of mesa regions preferably at or near layer 163c or 163d as shown in FIGS. 3C and 3D. The mesa regions of the first pair are disposed on opposite sides of the waveguide regions 177", 178" and extend along the length of the respective devices. Such etching operations form the top mesa structure (or rib) of the respective devices as described below.

For the spot-size converter waveguide device 100" of FIG. 3D, the sidewalls of the top mesa structure are laterally-tapered along the length of the device in a manner similar to FIG. 1A. Preferably, the curvature of the lateral taper is substantially continuous (i.e., without an abrupt change) over the length of the spot-size converter waveguide device and transforms the spot-size in a gradual "adiabatic" manner (which is designed to keep all optical power in one mode during propagation therethrough).

For the thyristor device 120" of FIG. 3C, an implant of n-type ions is implanted into the first pair of mesa regions to form N+-type implant regions 170, which are used to contact to the n-type QW structure 24 of the thyristor device. A metal layer 191 is deposited and defined on the first pair of mesa regions to form the injector terminals 38A and 38B (which are collectively referred to as the injector terminal 38) of the thyristor device, which are electrically coupled to the n-type QW structure 24 of the thyristor device. Preferably, the metal layer 191 comprises the same composite metal structure (e.g., NiInW metal structure) of the metal layer 174 of the anode terminals 36A, 36B as described above.

Next, a capping layer 183 of silicon nitride or other suitable dielectric is deposited such that it covers at least the metal layer 191 of the injector terminals 38A, 38B for the thyristor device 120" of FIG. 3C and covers at least the first pair of mesa regions of the spot-size converter waveguide device 100" of FIG. 3D.

Next, patterning and etching operations are performed that expose a second pair of mesa regions preferably at or near layer 153 as shown in FIGS. 3C and 3D. The mesa regions of the second pair are disposed on opposite sides of the waveguide region 177" and extend along the length of the respective devices.

For the thyristor device 120" of FIG. 3C, the mesa regions of the second pair provide for contact to the cathode terminal electrodes 40A and 40B of the thyristor device. Optionally, the patterning and etching operations can exposes additional mesa regions preferably at or near layer 158 for contacting the p-type QW inversion channel(s) of the multilayer structure. For the thyristor device, an ion implant of p+-type ion is implanted into the additional mesa regions to form P+-type implants, which are used to contact to the p-type QW inversion channel(s) 20 of the thyristor. Preferably, a mask covers the capping layer 183 (and the metal layer 191 of the injector terminals 38A, 38B of FIG. 3C) during a directional plasma etching operation that forms sidewalls that extend down from the edges of the capping layer 183 in a substantially-vertical direction to the mesa regions therebelow.

For the spot-size converter waveguide device 100" of FIG. 3D, the sidewalls leading from the first mesa regions to the mesa regions below are laterally-tapered along the length of the device in a manner similar to FIG. 1A. Preferably, the curvature of this lateral taper conforms to the lateral taper of the sidewalls of the top mesa structure as described above. In this manner, the lateral taper is substantially continuous (i.e., without an abrupt change) over the length of the spot-size converter waveguide device and transforms the spot-size in a gradual "adiabatic" manner (which is designed to keep all optical power in one mode during propagation therethrough).

The resultant structure is then covered with a cap layer 185 of silicon nitride or other suitable dielectric. The cap layer 185 is then subjected to a directional plasma etching operation that removes the cap layer 185 from portions of the second pair of mesa regions (and possibly from portions of the additional mesas for contacting the p-type modulation doped quantum well structure 20) for subsequent metallization thereon as described below. The directional plasma etching operation also preferably removes portions of the cap layer 185 that are disposed atop the cap layer 183 above the portions of the first mesa regions as well as portions of the cap layer 185 that are disposed atop the cap layer 183 above the top mesa structure of the respective devices, while leaving the cap layers 183 and 185 along the mesas and sidewalls of the respective devices as shown in FIGS. 3A and 3B. The remaining portions of the cap layers 183 and 185 protect against shorts between the terminal electrode metal layers of the thyristor device 120" as described herein.

The resultant structure is then covered by a metal layer 193, which preferably comprises the same composite metal structure (e.g., NiInW metal structure) of the metal layer 174 of the anode terminals 36A, 36B and the metal layer 191 of the injector terminals 38A, 38B as described above. The device structure is then subjected to an RTA operation on the order of 800° C. to 900° C. (or greater). The RTA operation has two primary purposes. First, it activates all of the implant regions. Secondly, it transforms the composite metal structure of the metal layers 174, 191, 193 to form low-resistance metal contact layers to both the n-type and p-type conduction channels of the thyristor device. Also note that during the RTA operation, the metal composite layers provide barrier layers to out-diffusion of the particular ion species that underlies such layers.

Next, the covering metal layer 193 is patterned and etched to form the cathode terminal electrodes 40A, 40B of the thyristor device 120" (and possibly to form the p-type injector terminal electrodes that are electrically-connected to the p-type QW inversion channel(s) 20 of the thyristor). The additional mesa regions, p-type implants and metallization for contacting to the p-type QW inversion channel(s) 20 of the thyristor are not shown in FIGS. 3C and 3D for simplicity of description. Preferably, the metal layer 193 is patterned by a wet etchant that removes only those portions of the metal layer 193 that overlie the cap layer 183 or that overlie the cap layer 185. These portions do not interface to the p-type and n-type contacts of the thyristor device and are not transformed during the RTA operation. The wet etchant does not react with those portions of the covering metal layer that interface to the p-type and n-type contacts of the thyristor device (and which are transformed to a low resistance contact metal structure during the RTA operation). An example of such a wet etchant suitable for use with the exemplary NiInW composite metal structures is sold by the Transene Company under the name TFG. In this manner, the metal layer 193 is formed on the cathode regions (layer 153) of the thyristor device 120" (and possibly on the p-type implants that contact the p-type modulation doped quantum well structure 20 for electrical contact thereto). The metal layer 193 is not formed on the spot-size converter waveguide device 100".

Next, a waveguide layer 111" is deposited such that it covers at least the laterally-tapered top mesa structure of the spot-size converter waveguide device 100" as shown in FIG. 3D. The thickness of the deposited waveguide layer 111" is dictated by the size of the off-chip larger-size optical element. For example, a thickness on the order of 10 microns can be used for interfacing to a single mode fiber. The waveguide layer 111" preferably comprises silicon or other suitable waveguiding material. A layer of photoresist (preferably on the order of 2-3 microns thick) is deposited atop the waveguide layer 111". The resultant structure is then patterned utilizing grayscale lithography (i.e., exposure by UV light through a grayscale mask and subsequent development) to impart a vertically-tapered structure to the photoresist layer in the region above the top mesa structure of the spot-size converter waveguide device. The vertically-tapered photoresist layer is then etched to transfer the vertically-tapered structure of the photoresist layer to the waveguide layer 111". Preferably, such etching operations employ an inductively-coupled plasma etching methodology with oxygen as the gas etchant. The vertical taper that is transferred to the waveguide layer 111" extends along the length of the waveguide device in a manner similar to FIG. 1B. Such etching operations preferably remove remaining portions of the cap layer 183 and the cap layer 185 (if any) from the top mesa structure of the thyristor device 120" and possibly remove remaining portions of the waveguide layer 111", cap layer 183 and cap layer 185 (if any) from the top mesa structure of the spot-size converter waveguide device 120" in the area adjacent the thyristor device 120" (not shown). This feature ensures that the waveguide region 178" of the spot-size converter waveguide device 100" is substantially aligned in the vertical direction relative to the waveguide region 177" of the thyristor device 120" at the interface therebetween, which minimizes coupling losses. Note that the waveguide layer 111" has a lateral taper defined by the lateral taper of the sidewalls of the top mesa structure thereunder.

Next, the respective devices are isolated from other devices by an etch down to the semi-insulating substrate 149 as shown in FIGS. 3C and 3D. Preferably, the isolation etch down to the semi-insulating substrate 149 is accomplished by a directional plasma etching operation. The sidewalls of the isolation etch are disposed on opposite sides of the waveguide regions of the respective devices and extend along the length of the respective devices. For the spot-size converter waveguide device 100" of FIG. 3D, these sidewalls are laterally-tapered along the length of the device in a manner similar to FIG. 1A. Preferably, the curvature of this lateral taper conforms to the lateral taper of the sidewalls of the mesa structures thereabove. In this manner, the lateral taper is substantially continuous (i.e., without an abrupt change) over the length of the spot-size converter waveguide device and transforms the spot-size in a gradual "adiabatic" manner (which is designed to keep all optical power in one mode during propagation therethrough).

Next, the resulting structure is oxidized in a steam ambient to convert layers 151 to AlO, which form the bottom DBR mirror for the respective devices.

To form an active device suitable for in-plane optical injection into a resonant vertical cavity and/or for in-plane optical emission from the resonant vertical cavity, a diffraction grating (for example, as described in detail in U.S. Pat. No. 6,031,243) is formed above the waveguide region 177" of the thyristor device 120" of FIG. 3C. Preferably, the diffraction grating is formed by ion beam milling of the top dielectric layer 181 of the thyristor device.

Finally, one or more dielectric layer pairs (one shown as 122A, 122B) are deposited on the structure as shown in FIGS. 3C and 3D. The dielectric layer pairs form the highly-reflective mirror 122" of the respective devices. Preferably, the dielectric layer pairs comprise $SiO_2$ (lower refractive index material) and a high refractive index material such as GaAs, Si, or GaN. The top mirror 122" can achieve high reflectivity by employing multiple dielectric layer pairs. In the preferred embodiment, six or more dielectric layer pairs can be stacked upon one another to provide a reflectivity on the order of 99.7% or greater.

For the thyristor device 120" of FIG. 3C, the mirror 122" overlies the waveguide region 177" and cooperates with the bottom DBR mirror (layers 151, 152) to provide a resonant cavity wherein vertical confinement is provided by the top portion of the mirror 122" and the bottom DBR mirror and lateral confinement is provided primarily by the n-type implant regions 175". The top mirror (layers 122A, 122B) covers the sidewalls of the thyristor device 120" as shown, which provides high-reflectivity sidewall cladding for additional lateral confinement.

For the spot-size converter waveguide device 100" of FIG. 3D, the mirror 122" is formed continuously over the vertically-tapered waveguide layer 111" to thereby realize a vertically-tapered top mirror that extends along the length of the waveguide device. The sidewalls of the waveguide device 100" are tapered along its length similar to the taper design shown in FIG. 1A. The mirror 122" is formed continuously over the device 100" to cover the laterally-tapered sidewalls to thereby realize a laterally-tapered mirror that overlies the sidewalls of the waveguide device 100" over it length. The vertically-tapered top mirror and the bottom mirror provide for vertical confinement of light along the length of the device 100", while the laterally-tapered mirror structures that cover the sidewalls of the device 100" provide for lateral confinement of light along the length of the waveguide device 100". The vertical and lateral tapered design of the waveguide device 100" provides a waveguide region 178" that transforms the mode of light along the waveguide device from a larger-size mode at one end to a smaller-size mode at the other end, which substantially conforms to and is aligned with the waveguide region 177" of the thyristor device 120" of FIG. 3C. This limits optical loss in coupling the integrated thyristor device 100" to an off-chip larger-size optical element (e.g., fiber or free-space optics).

The multilayer structure of FIGS. 3A and 3B can also be used to realize various transistor devices (including n-channel HFET devices, p-channel HFET devices, n-type quantum-well-base bipolar transistors and p-type quantum-well-base bipolar transistors) as described in detail in U.S. Pat. No. 6,841,795. One or more of these transistor devices can be integrally formed on the multilayer structure of FIG. 3A together with the thyristor device 120" of FIG. 3C and/or the spot-size converter passive waveguide device 100" of FIG. 3D.

There are many advantages gained by the photonic integrated circuitry described herein including low optical losses in carrying out the desired spot-sized conversion and manufacturability is much improved. Moreover, a broad array of photonic devices can be integrated to form a monolithic photonic integrated circuit suitable for many diverse applications. Such photonic devices may include an optoelectronic thyristor. The thyristor has unique properties of sensitive detection in its OFF state and laser emission in its ON state. The thyristor structure may be used as a digital modulator, a transceiver, an amplifier and a directional coupler. These devices may be realized as either waveguide or vertical cavity devices. The vertical cavity construction enables resonant cavity operation of all device modes. In addition to the multiple photonic devices, a wide array of transistor devices (including complementary HFET devices and complementary quantum-well-base bipolar transistors) are implementable as part of the monolithic photonic integrated circuit.

There have been described and illustrated herein several embodiments of an integrated circuit that employs a low-loss spot-size converter waveguide device, and a method of fabricating such circuitry. While particular embodiments of the invention have been described, it is not intended that the invention be limited thereto, as it is intended that the invention be as broad in scope as the art will allow and that the specification be read likewise. For example, an integrated circuit can include the spot-size converter waveguide devices of the present invention as described herein interface to a passive photonic device (such as a passive coupler, passive splitter, passive combiner, etc) that is integrally formed therewith. Moreover, the geometry and shape of the spot-size converter waveguide devices as described herein can be modified. For example, the waveguide can be adapted to include a vertically-tapered section that provides for spot-size transformation along the vertical projection of the section and a laterally-tapered section that provides for spot-size transformation along the lateral projection of the section. In yet another example, the waveguide can be extended to include non-tapered sections that interface to the off-chip optical element and/or to the on-chip photonic device. Moreover, while particular material systems and device structures have been disclosed, it will be appreciated that a broad variety of material systems and device structures can be used to implement the photonic integrated circuitry described herein. In addition, while layers have been described with particular thicknesses and with particular types and strengths of dopings, it will be appreciated that certain transition layers could be removed and/or additional layers and/or sublayers could be utilized, and further that the layers could have different thicknesses and be differently doped. Also, while particular layers have been described with reference to their percentage content of certain constituents, it will be appreciated that the layers could utilize the same constituents with different percentages, or other constituents. Additionally, while particular formation and metallization techniques have been described, it will be appreciated that the described structures can be formed in other manners, and other metals used to form terminals. Further, while particular arrangements of photonic devices have been described, it will be appreciated that other photonic devices and circuits can be made from the provided structure and components. It will therefore be appreciated by those skilled in the art that yet other modifications could be made to the provided invention without deviating therefrom.

What is claimed is:

1. An integrated circuit comprising:
a photonic device and a spot-size converter waveguide device integrated on a common substrate, said spot-size converter waveguide device providing for transformation between a larger spot-size and a smaller spot-size corresponding to said photonic device, said spot-size converter waveguide device including a bottom mirror and top mirror, the top mirror defined by a plurality of layer pairs each comprising first and second dielectric materials, the second dielectric material having a higher refractive index relative to the first dielectric material, wherein said top mirror provides for vertical confinement of light propagating through said spot-size converter waveguide device, and wherein said top mirror overlies opposing sidewalls of the spot-size converter waveguide device to provide for lateral confinement of light propagating through said spot-size converter waveguide device.

2. An integrated circuit according to claim 1, wherein:
the bottom mirror is defined by a distributed bragg reflector (DBR) mirror structure.

3. An integrated circuit according to claim 2, wherein:
at least one layer of the DBR mirror structure is oxidized by exposure to steam.

4. An integrated circuit according to claim 1, wherein:
the first dielectric material comprises $SiO_2$ and the second dielectric material comprises at least one of GaAs, Si, and GaN.

5. An integrated circuit according to claim 1, wherein:
at least a portion of said spot-sized converter waveguide device includes a vertically-tapered waveguide layer underlying the top mirror.

6. An integrated circuit according to claim 5, wherein:
the vertically-tapered waveguide layer is formed by depositing photoresist over the waveguide layer, applying grayscale lithography to impart a vertical taper to the photoresist, and etching the photoresist and waveguide layer to transfer the vertical taper of the photoresist to the waveguide layer.

7. An integrated circuit according to claim 5, wherein:
the vertically-tapered waveguide layer comprises silicon.

8. An integrated circuit according to claim 1, wherein:
at least a portion of said sidewalls underlying the top mirror are laterally tapered.

9. An integrated circuit according to claim 1, wherein:
a portion of said spot-size converter waveguide includes both a vertically-tapered waveguide layer underlying the top mirror and laterally-tapered sidewalls underlying the top mirror.

10. An integrated circuit according to claim 1, wherein:
at least a portion of said spot-size converter waveguide and said photonic device include ion implant regions that are disposed opposite one another and that continuously extend adjacent sidewalls of the respective devices.

11. An integrated circuit according to claim 1, wherein:
the photonic device comprises an active device formed in a vertical cavity defined by the same bottom and top mirror structures as used for the bottom mirror and top mirror of the spot-converter waveguide device.

12. An integrated circuit according to claim 11, further comprising:
a diffraction grating formed under the top mirror structure of the active device;
wherein, for vertical cavity emitting applications, said diffraction grating diffracts light produced by the vertical cavity into light propagating in a lateral direction; and
wherein, for detection applications, said diffraction grating diffracts light that is propagating in the lateral direction into the vertical cavity for resonant absorption therein.

13. An integrated circuit according to claim 11, wherein:
the active device comprises a thyristor.

14. An integrated circuit according to claim 13, wherein:
the thyristor includes an anode terminal electrode, a cathode terminal electrode, and at least one injector terminal electrode.

15. An integrated circuit according to claim 14, wherein:
the thyristor includes an n-type modulation quantum well structure and a p-type modulation doped quantum well structure.

16. An integrated circuit according to claim 15, wherein:
said n-type modulation doped quantum well structure is formed above an inverted p-type modulation doped quantum well structure.

17. An integrated circuit according to claim 15, wherein:
said thyristor includes first ion implant regions comprising n-type ions that electrically couple said at least one injector terminal electrode to said n-type modulation doped quantum well structure.

18. An integrated circuit according to claim 17, wherein:
said thyristor includes second ion implant regions comprising p-type ions that electrically couple another injector terminal electrode to said p-type modulation doped quantum well structure.

19. An integrated circuit according to claim 17, wherein:
said thyristor includes third ion implant regions comprising n-type ions that are disposed above said n-type modulation doped quantum well structure and that steer current into said n-type modulation doped quantum well structure, said third ion implant regions extending into at least a portion of said spot-converter waveguide device.

20. An integrated circuit according to claim 14, wherein:
said thyristor operates in an OFF state and an ON state, wherein current does not flow between said anode terminal electrode and said cathode terminal electrode in said OFF state, and wherein current flows between said anode terminal electrode and said cathode terminal electrode in said ON state.

21. An integrated circuit according to claim 15, wherein:
said thyristor device switches from said OFF state to said ON state in response to optical energy supplied by an input optical signal and resonantly absorbed in at least one of said n-type quantum well structure and said p-type quantum well structure.

22. An integrated circuit according to claim 15, wherein:
said heterojunction thyristor device switches from said OFF state to said ON state in the event that said optical energy resonantly absorbed in at least one of said n-type quantum well structure and said p-type quantum well structure causes charge in said at least one of said n-type quantum well structure and said p-type quantum well structure to exceed a critical switching charge.

23. An integrated circuit according to claim 15, wherein:
said thyristor device switches from said OFF state to said ON state in response to electrical energy that is injected via said at least one injector terminal into at least one of said n-type quantum well structure and said p-type quantum well structure.

24. An integrated circuit according to claim 15, wherein:
said thyristor switches from said OFF state to said ON state in the event that said electrical energy injected into at least one of said n-type quantum well structure and said p-type quantum well structure causes charge in said at least one of said n-type quantum well structure and said p-type quantum well structure to exceed a critical switching charge.

25. An integrated circuit according to claim 15, wherein:
said thyristor device switches from said OFF state to said ON state in response to bias current that draws charge via said at least one injector terminal from at least one of said n-type quantum well structure and said p-type quantum well structure.

26. An integrated circuit according to claim 15, wherein:
said thyristor device switches from said OFF state to said ON state in the event that said bias current reduces charge in at least one of said n-type quantum well structure and said p-type quantum well structure below a holding charge.

27. An integrated circuit according to claim 13, wherein:
said thyristor device is adapted to operate as a laser to produce an output optical signal in said ON state.

28. An integrated circuit according to claim 13, wherein:
said thyristor device is adapted to operate as an optical detector to produce an output electrical signal in said ON state.

29. An integrated circuit according to claim 13, wherein:
said thyristor device is adapted to operate as a digital optical modulator.

30. An integrated circuit according to claim 13, wherein said thyristor device is adapted to operate as an optical amplifier.

31. An integrated circuit according to claim 14, wherein:
the anode terminal electrode, the cathode terminal electrode, and the at least one injector terminal electrode of said thyristor device are all realized from a common metal material comprising Nickel (Ni), Indium (In) and Tungsten (W).

32. An integrated circuit according to claim 13, wherein:
the thyristor device has sidewalls that are covered by at least one capping layer realized from a dielectric material.

33. An integrated circuit according to claim 32, wherein:
said dielectric material comprises silicon nitride.

34. An integrated circuit according to claim 1, wherein:
said spot-size converter waveguide device has sidewalls that are covered by at least one capping layer realized from a dielectric material.

35. An integrated circuit according to claim 34, wherein:
said dielectric material comprises silicon nitride.

36. An integrated circuit according to claim 1, wherein:
said photonic device carries out an active photonic function selected from the group including: laser transmission, optical-to-electrical conversion, bidirectional transmission and optical-to-electrical conversion, optical amplification, optical modulation, optical coupling and cross-connection.

37. An integrated circuit according to claim 1, wherein:
said photonic device carries out a passive photonic function.

38. An integrated circuit according to claim 1, wherein:
said photonic device and said spot-size converter device are realized from an epitaxial multilayer sandwich comprising group III-V materials.

* * * * *